United States Patent
Scheer et al.

(10) Patent No.: US 12,033,032 B2
(45) Date of Patent: Jul. 9, 2024

(54) MODULAR QUANTUM PROCESSOR ARCHITECTURES

(71) Applicant: Rigetti & Co, LLC, Berkeley, CA (US)

(72) Inventors: Michael Justin Gerchick Scheer, Oakland, CA (US); Maxwell Benjamin Block, Oakland, CA (US); Benjamin Jacob Bloom, Oakland, CA (US); Matthew J. Reagor, Corte Madera, CA (US); Alexander Papageorge, San Francisco, CA (US); Kamal Yadav, Fremont, CA (US); Nasser Alidoust, Berkeley, CA (US); Colm Andrew Ryan, Albany, CA (US); Shane Arthur Caldwell, Oakland, CA (US); Yuvraj Mohan, Fremont, CA (US); Anthony Polloreno, Carlsbad, CA (US); John Morrison Macaulay, Emeryville, CA (US); Blake Robert Johnson, El Cerrito, CA (US)

(73) Assignee: Rigetti & Co, LLC, Berkeley, CA (US)

( * ) Notice: Subject to any disclaimer, the term of this patent is extended or adjusted under 35 U.S.C. 154(b) by 655 days.

(21) Appl. No.: 17/119,089

(22) Filed: Dec. 11, 2020

(65) Prior Publication Data
US 2021/0342729 A1     Nov. 4, 2021

Related U.S. Application Data

(63) Continuation of application No. PCT/US2019/037303, filed on Jun. 14, 2019.
(Continued)

(51) Int. Cl.
*G06F 15/78*     (2006.01)
*G06F 30/373*     (2020.01)
(Continued)

(52) U.S. Cl.
CPC ......... *G06N 10/40* (2022.01); *G06F 15/7896* (2013.01); *G06F 30/373* (2020.01); *G06F 30/392* (2020.01); *G06F 30/3947* (2020.01)

(58) Field of Classification Search
CPC .. G06F 15/7896; G06F 30/373; G06F 30/392; G06F 30/3947
(Continued)

(56) References Cited

U.S. PATENT DOCUMENTS

| | | | |
|---|---|---|---|
| 7,932,515 | B2 | 4/2011 | Bunyk |
| 9,836,699 | B1 | 12/2017 | Rigetti et al. |

(Continued)

FOREIGN PATENT DOCUMENTS

| | | | | |
|---|---|---|---|---|
| WO | WO-2015178992 A2 | * | 11/2015 | ............. G06F 13/36 |
| WO | WO-2017021714 A1 | * | 2/2017 | ............. G06N 10/00 |
| WO | 2020036673 | | 2/2020 | |

OTHER PUBLICATIONS

Kipo, International Search and Written Opinion mailed Mar. 13, 2020, in PCT/US2019/037303, 12 pgs.
(Continued)

*Primary Examiner* — Phallaka Kik
(74) *Attorney, Agent, or Firm* — Henry Patent Law Firm PLLC

(57) ABSTRACT

In a general aspect, a quantum processor has a modular architecture. In some aspects, a modular quantum processor includes first and second quantum processor chips and a cap structure. The first quantum processor chip is supported on a substrate layer and includes a first plurality of qubit devices. The second quantum processor chip is supported on the substrate layer and includes a second plurality of qubit devices. The cap structure is supported on the first and second quantum processor chips and includes a coupler device that provides coupling between at least one of the first
(Continued)

plurality of qubit devices with at least one of the second plurality of qubit devices. In some instances, the coupler device is an active coupler device that is configured to selectively couple at least one of the first plurality of qubit devices with at least one of the second plurality of qubit devices.

8 Claims, 14 Drawing Sheets

Related U.S. Application Data

(60) Provisional application No. 62/684,855, filed on Jun. 14, 2018.

(51) Int. Cl.
  *G06F 30/392* (2020.01)
  *G06F 30/3947* (2020.01)
  *G06N 10/40* (2022.01)

(58) Field of Classification Search
  USPC .......................................... 716/100, 119, 129
  See application file for complete search history.

(56) References Cited

U.S. PATENT DOCUMENTS

| | | | |
|---|---|---|---|
| 10,971,672 B2 | 4/2021 | Olivadese et al. | |
| 2009/0173936 A1* | 7/2009 | Bunyk | B82Y 10/00 257/31 |
| 2009/0321720 A1 | 12/2009 | Rose | |
| 2012/0023053 A1* | 1/2012 | Harris | B82Y 10/00 706/45 |
| 2012/0326720 A1 | 12/2012 | Gambetta et al. | |
| 2016/0019468 A1* | 1/2016 | Bunyk | B82Y 10/00 505/170 |
| 2016/0267032 A1* | 9/2016 | Rigetti | G06F 13/4068 |
| 2016/0364653 A1 | 12/2016 | Chow et al. | |
| 2017/0091650 A1 | 3/2017 | King | |
| 2017/0286859 A1 | 10/2017 | Harris et al. | |
| 2018/0012932 A1* | 1/2018 | Oliver | H01L 23/552 |
| 2018/0308007 A1* | 10/2018 | Amin | G06N 3/047 |
| 2019/0044047 A1* | 2/2019 | Elsherbini | H01L 23/49888 |
| 2019/0325336 A1* | 10/2019 | Reilly | G06N 10/00 |

OTHER PUBLICATIONS

Brecht, et al., "Micromachined Integrated Quantum Circuit Containing a Superconducting Qubit", Physical Review Applied 7, 044018, 2017, 6 pgs.
Brecht, et al., "Multilayer microwave integrated quantum circuits for scalable quantum computing", arXiv:1509.01127v2 [quant-ph], Sep. 11, 2015, 5 pgs.
Caldwell, et al., "Parametrically Activated Entangling Gates Using Transmon Qubits", arXiv:1706.06562v2 [quant-ph], Dec. 8, 2017, 7 pgs.
Didier, et al., "Analytical modeling of parametrically-modulated transmon qubits", arXiv: 1706.06566v2 [quant-ph], Jan. 12, 2018, 16 pgs.
Lucero, et al., "Reduced phase error through optimized control of a superconducting qubit", Physical Review A 82, 042339, Oct. 29, 2010, 7 pgs.
Mckay, David C., et al., "A universal gate for fixed-frequency qubits via a tunable bus", arXiv:1604.03076v3 [quant-ph], Dec. 19, 2016, 12 pages.
Naik, R. K., et al., "Random access quantum information processors", arXiv:1705.00579v1 [quant-ph], May 1, 2017, 7 pages.
Niskanen, et al., "Quantum Coherent Tunable Coupling of Superconducting Qubits", Science 316, 723, May 4, 2007, 5 pgs.
O'Malley, et al., "Qubit Metrology of Ultralow Phase Noise Using Randomized Benchmarking", arXiv:1411.2613v3, Apr. 16, 2015, 11 pgs.
Reagor, et al., "Demonstration of Universal Parametric Entangling Gates on a Multi-Qubit Lattice", arXiv:1706.06570v3 [quant-ph], Feb. 27, 2018, 17 pgs.
Rol, et al., "A fast, low-leakage, high-fidelity two-qubit gate for a programmable superconducting quantum computer", arXiv:1903.02492v1 [quant-ph], Mar. 6, 2019, 18 pgs.
Rosenberg, et al., "3D integrated superconducting qubits", arXiv:1706.04116v2 [quant-ph], Jun. 19, 2017, 6 pgs.
Sank, et al., "Flux Noise Probed with Real Time Qubit Tomography in a Josephson Phase Qubit", Physical Review Letters 109, 067001, Aug. 2012, 5 pgs.
Versluis, et al., "Scalable quantum circuit and control for a superconducting surface code", arXiv:1612.08208v1, Dec. 24, 2016, 9 pgs.
EPO, Extended European Search Report mailed Jul. 4, 2022, in EP 19849758.8, 17 pgs.
Gold, et al., "Entanglement Across Separate Silicon Dies in a Modular Superconducting Qubit Device", arXiv:2102.13293v2, Mar. 11, 2021, 9 pgs
Leung, et al., "Deterministic Bidirectional Communication and Remote Entanglement Generation Between Superconducting Quantum Processors", arXiv:1804.02028v1, 15 pgs.
Monroe, C., et al., "Large-scale modular quantum-computer architecture with atomic memory and photonic interconnects", Phys Rev. A, 89 022317, 2014, 16 pgs.
Narla, A., et al., "Robust Concurrent Remote Entanglement Between Two Superconducting Qubits", Phys. Rev. X 6, 031036, 2016, 18 pgs.

* cited by examiner

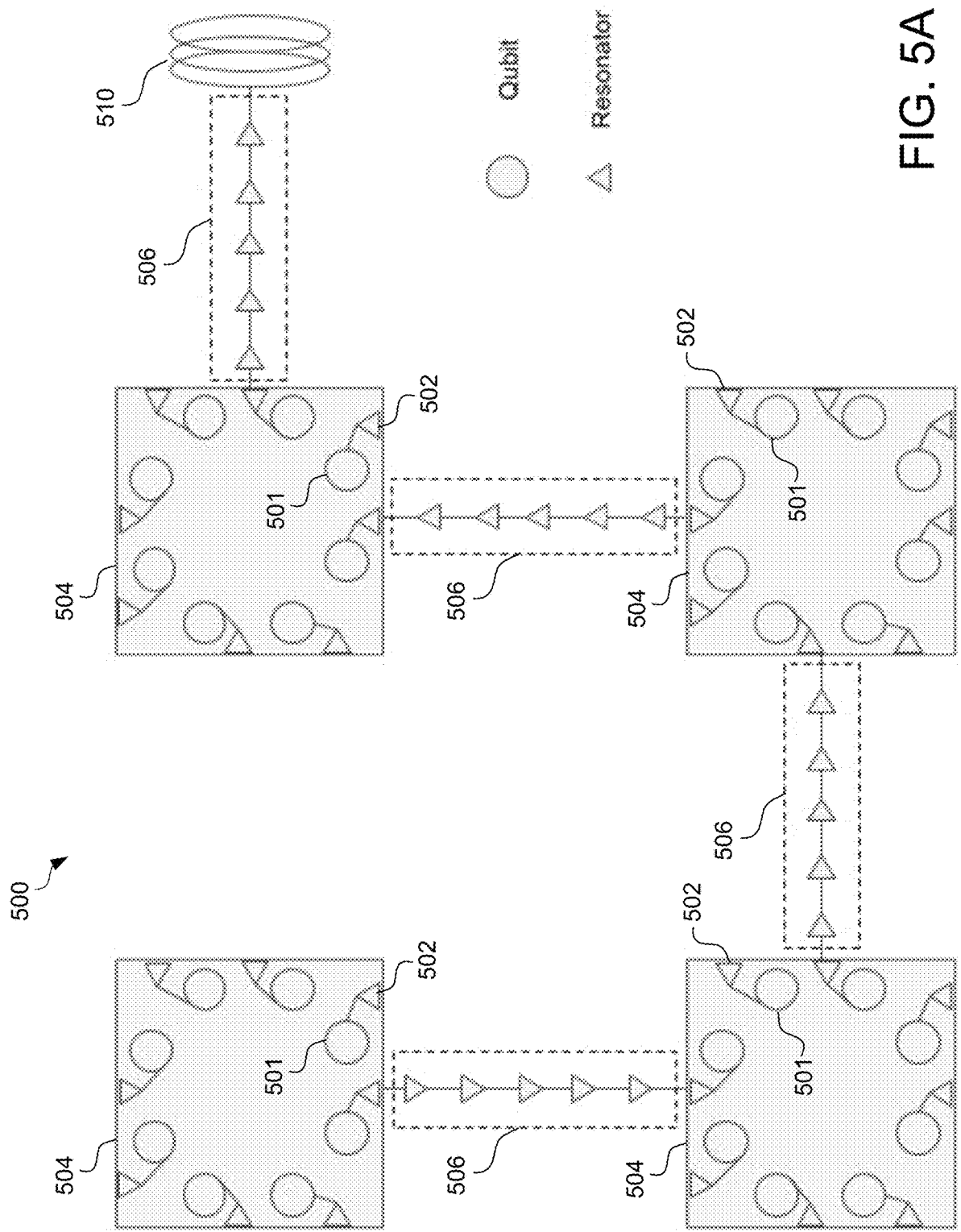

MODULAR QUANTUM PROCESSOR ARCHITECTURES

CROSS-REFERENCE TO RELATED APPLICATIONS

This application is a continuation of PCT/US2019/037303 filed Jun. 14, 2019, and entitled "Modular Quantum Processor Architectures," which claims priority to U.S. Provisional Application No. 62/684,855 filed Jun. 14, 2018 and entitled "Modular Quantum Processor Architectures." The contents of all the above-referenced priority application are hereby incorporated by reference.

BACKGROUND

The following description relates to modular quantum processor architectures and manufacturing of modular quantum processors.

In some quantum information processing architectures, qubits are implemented in microwave integrated circuits. For example, qubits can be implemented in circuit devices that include Josephson junctions formed on a substrate.

DESCRIPTION OF DRAWINGS

FIG. 5A is a diagram of a modular quantum processor that includes multiple quantum circuit chips coupled to one another by resonator buses.

DETAILED DESCRIPTION

Figure 1:
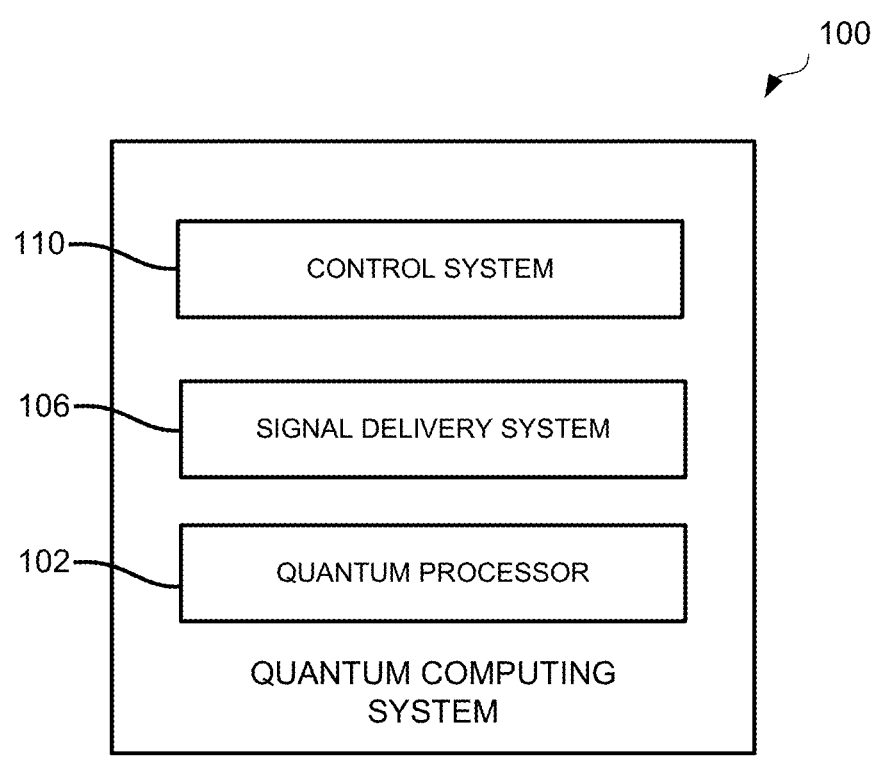
FIG. 1 is a block diagram of an example quantum computing system.

In some aspects of what is described here, a quantum processor includes multiple distinct quantum processor modules. For example, in some implementations, a quantum processor that includes N qubit devices may be manufactured from M distinct quantum processor modules that each include N/M qubit devices. Using multiple quantum processor modules may allow for each module chip to be individually fabricated and tested, and may increase overall manufacturing yields (e.g., the percentage of manufactured chips that perform below specification may decrease). In addition, modular architectures may allow for quantum processor module chips to be separately designed, such that different types or categories of chips with different architectures or purposes can be incorporated into a common structure or architecture.

In some cases, a modular quantum processor includes a large substrate (e.g., silicon, sapphire, etc.) or layer of substrates onto which the quantum processor module chips are bonded (e.g., using wirebonds, through-silicon signal vias, bump-bonds, or a combination thereof). The substrate layer may include signal lines as well as coupler structures that allow the chips to communicate with each other and with an external control system. In some cases, a modular quantum processor includes quantum processor module chips that are inter-connected on a printed circuit board (PCB) that includes routing lines and vias (e.g., superconducting vias, non-superconducting vias, or both). In some instances, it may be beneficial from an attenuation perspective to have signaling lines composed of superconducting material. The various quantum processor module chips may be coupled to one another through structures or traces of one or more bonded caps that overlap multiple chips, through traces or transmission lines in or on the substrate, or through other structures that are coupled to such caps or substrates. In some cases, the quantum processor module chips can sit on a substrate or substrate layer, and the coupling between different chips may be provided through wirebonds. Any of the above concepts can be combined with one another to form a modular quantum processor architecture.

In some implementations, a modular architecture includes quantum processor modules that are specialized for different purposes (e.g. computation, memory, others). The chips can be coupled by a resonator bus which has many modes. The resonator bus may allow for a higher bandwidth of coupling between the different quantum processor modules. For example, to maintain high-connectivity, a bus of resonators may be used to couple qubits between different quantum processor module chips within a modular quantum processor. The number of resonator modes in a resonator bus may determine the number of simultaneous two-qubit operations that are possible. In some cases, transmission lines can be routed in three dimensions within the substrate (e.g. multi-layer PCBs) allowing for a wider range of connectivity architectures, such that couplings can be generated between non-immediate-neighbor quantum processor module chips, for example.

In some implementations, a quantum processor includes multiple different types of quantum processor modules, and each module may provide a distinct type of circuit device or functionality. For instance, different types of on-chip devices may be implemented in different modules. As an example, quantum limited amplifiers or other devices may be implemented in a first set of quantum processor modules, while qubit devices and associated readout resonators are implemented in a second set of quantum processor modules.

In some implementations, many identical quantum processor modules are used, for example, to leverage the manufacturability and modularity of repeatable device units. For example, in some cases, each quantum processor module can be fabricated and tested by the same fabrication and testing process, to provide a streamlined production of critical or sensitive components (e.g., qubit devices). The modules can then be integrated with other components to form a larger quantum processor structure.

In some implementations, a modular quantum processor architecture includes many small quantum processor modules that are separately fabricated, tested, and then assembled into a larger system using a PCB or another type of substrate. For at least some manufacturing processes, the number of quantum processor chips that must be fabricated to produce a single chip with N working qubits in a monolithic (non-modular) architecture increases exponentially with N, but with a modular architecture, the relationship can become linear with N (e.g., if the number of qubits per module is chosen appropriately). In some cases, a batch of quantum processor modules can be sorted or categorized, with the "best" chips being used to construct a modular quantum processor with a large number of qubits. This approach can improve yields as tested components can be stacked for higher throughput, etc.

The quantum processor module chips can be integrated on a PCB or other substrate or substrate layer, and connected to signal lines, for example, that include superconducting vias. The vias may extend three-dimensionally in the substrate or substrate layer, and may include signal vias that extend from the surface of the quantum processor module chips to the surface of the substrate or substrate layer. In some implementations, a circuit on a PCB or other substrate or substrate layer can include signal routing and bond pads, where the individual quantum processor module chips are bonded using precision alignment and bonding technologies. Distinct chips can be coupled to one another through structures defined in a cap that extends over multiple chips, or in another manner. In some cases, caps may also be fabricated and bonded on top of the chips individually with precision bonding.

In some implementations, deploying qubit devices on multiple quantum processor chips can provide an improved spatial layout for connecting the qubit devices to external control systems. For example, the spacing between quantum processor chips on a substrate layer can be selected to improve or optimize the pitch of vertical connections to input and output signal connections. In some scenarios, signal lines are deployed as vertical (e.g., out of plane) connections to the quantum processor chips that have horizontal (e.g., in plane) connections between qubit devices, and the spacing between quantum processor chips can provide additional space to incorporate such vertical connections. Furthermore, in some scenarios, bond pads on a substrate layer are arranged such that (1) a plurality of quantum processor chips can be placed and bonded with good electrical contact and micron scale alignment accuracy, and/or (2) input/output transmission lines are arranged such that wirebonds (or other electric contacts) connect resonators on the quantum processor chips to external sources in a control system after the quantum processor chips have been bonded to the substrate layer.

FIG. 1 is a schematic diagram of an example quantum computing system 100. The example quantum computing system 100 shown in FIG. 1 includes a control system 110, a signal delivery system 106, and a quantum processor 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. Control signals can manipulate the quantum states of individual qubits and the joint states of multiple qubits. In some instances, conditional quantum logic can be performed in a manner that allows large-scale entanglement within the quantum processor 102. In some instances, information can be read out from the composite quantum system by measuring the quantum states of the individual qubits.

The quantum computing system 100 can operate using a gate-based model, an adiabatic model or another type of model for quantum computing. In some implementations, the quantum computing system 100 is constructed and operated according to a scalable quantum computing architecture. For example, in some cases, the architecture can be scaled to a large number of qubits to achieve a large-scale general purpose coherent quantum computer. In some instances, the architecture is adaptable and can incorporate a variety of modes for each technical component. For example, the architecture can be adapted to incorporate different types of qubit devices, coupler devices, resonator devices, readout devices, signaling devices, etc.

The example quantum processor 102 shown in FIG. 1 includes qubit devices that are used to store and process quantum information. In some instances, all or part of the quantum processor 102 functions as a quantum processor, a quantum memory, or another type of subsystem. The quantum processor 102 shown in FIG. 1 can be a modular quantum processor, for example, according to any of the modular architectures shown in FIGS. 3A-3D, 4A-4B, 5A-5B, or another type of modular architecture. Components of the quantum processor 102 shown in FIG. 1 may be manufactured according to the process 600 of FIG. 6, or in another manner.

In some implementations, the quantum processor 102 includes one or more microwave integrated circuits that include multiple quantum circuit devices. For instance, qubits can be defined in respective qubit devices that each include one or more Josephson junctions, superconducting quantum interference device (SQUID) loops, or other features. The microwave integrated circuits and constituent quantum circuit devices can be defined on one or more substrates. For example, the microwave integrated circuitry may be defined on crystalline silicon or sapphire substrates, fused silica or fused quartz substrates, or substrates of another material.

In some implementations, the quantum processor 102 includes a two-dimensional or three-dimensional device array, which includes devices arranged in a lattice structure. For instance, a two-dimensional device array can be formed on a two-dimensional substrate, where the devices (e.g., qubit devices) are arranged in a two-dimensional lattice structure and configured to communicate with one another. A three-dimensional device array can be formed by a stack of two-dimensional substrates, where the devices are arranged in a three-dimensional lattice structure and configured (e.g., by superconducting through-vias defined in the substrates or substrate layers) to communicate with one another.

The example quantum processor 102 shown in FIG. 1 includes multiple quantum processor modules. For example, the quantum processor 102 may include a two-dimensional or three-dimensional array of quantum processor modules, and each quantum processor module may include an array of circuit devices. In some cases, the quantum processor modules are supported on a common substrate or substrate layer, are connected to a common cap structure, or are otherwise integrated in another type of common structure (e.g., a housing). Accordingly, N qubit devices in the quantum processor 102 can be implemented in M distinct quantum processor modules. Each of the quantum processor modules may include the same number (e.g., N/M) and type of devices, or quantum processor modules containing different numbers of devices or disparate types of devices may be integrated in the quantum processor 102.

In the example quantum processor 102, the qubit devices each store a single qubit (a bit of quantum information), and the qubits can collectively define the computational state of a quantum processor or quantum memory. The quantum processor 102 may also include readout devices that selectively interact with the qubit devices to detect their quantum states. For example, readout resonators may be configured to produce readout signals that indicate a computational state of the quantum processor or quantum memory. The quantum processor 102 may also include coupler devices that selectively operate on individual qubits or pairs of qubits. For example, the coupler devices may produce entanglement or other multi-qubit states over two or more qubits in the quantum processor 102.

In some implementations, the example quantum processor 102 can process the quantum information stored in the qubits by applying control signals to the qubit devices or to other devices housed in the quantum processor. For example, a sequence of operations can be applied to the qubits to perform a quantum algorithm. The quantum algorithm may correspond to a computational task, a quantum error correction procedure, a quantum state distillation procedure, or a combination of these and other types of operations.

In the example shown in FIG. 1, the signal delivery system 106 provides communication between the control system 110 and the quantum processor 102. For example, the signal delivery system 106 can receive control signals from the control system 110 and deliver the control signals to the quantum processor 102. In some instances, the signal delivery system 106 performs preprocessing, signal conditioning, or other operations to the control signals before delivering them to the quantum processor 102. The signal delivery system 106 may also receive readout signals or other signals from the quantum processor 102 and deliver the signals to the control system 110.

In some implementations, the signal delivery system 106 includes input and output processing hardware, input and output connections, and other components. The input and output processing hardware may include, for example, filters, attenuators, directional couplers, multiplexers, diplexers, bias components, signal channels, isolators, amplifiers, power dividers and other types of components. In some implementations, the signal delivery system 106 provides connections between different temperature and noise regimes. For example, the quantum computing system 100 may include a series of temperature stages between a higher temperature regime of the control system 110 and a lower temperature regime of the quantum processor 102.

In the example quantum computing system 100 shown in FIG. 1, the control system 110 controls operation of the quantum processor 102. The example control system 110 may include data processors, signal generators, interface components and other types of systems or subsystems. In some cases, the control system 110 includes one or more classical computers or classical computing components. For example, a classical computing system can be configured to compile instructions (e.g., control signals or sets of control signals) for the quantum processor 102. The control system 110 can generate control signals that are communicated to the quantum processor 102 by the signal delivery system 106, and the devices in the quantum processor 102 can execute operations in response to the control signals.

In some cases, the control system 110 includes a microwave signal source (e.g., an arbitrary waveform generator), a bias signal source and other components that generate control signals to be delivered to the quantum processor 102. The example control system 110 may include conversion hardware that digitizes response signals received from the quantum processor 102. The digitized response signals may be provided, for example, to a classical processor in the control system 110.

In some cases, the quantum computing system 100 includes multiple quantum processors 102 that operate as respective quantum processor units (QPU). In some cases, each QPU can operate independently of the others. For instance, the quantum computing system 100 may be configured to operate according to a distributed quantum computation model, or the quantum computing system 100 may utilize multiple QPUs in another manner. In some implementations, the quantum computing system 100 includes multiple control systems, and each QPU may be controlled by a dedicated control system. In some implementations, a single control system can control multiple QPUs; for instance, the control system 110 may include multiple domains that each control a respective QPU.

Figure 2:
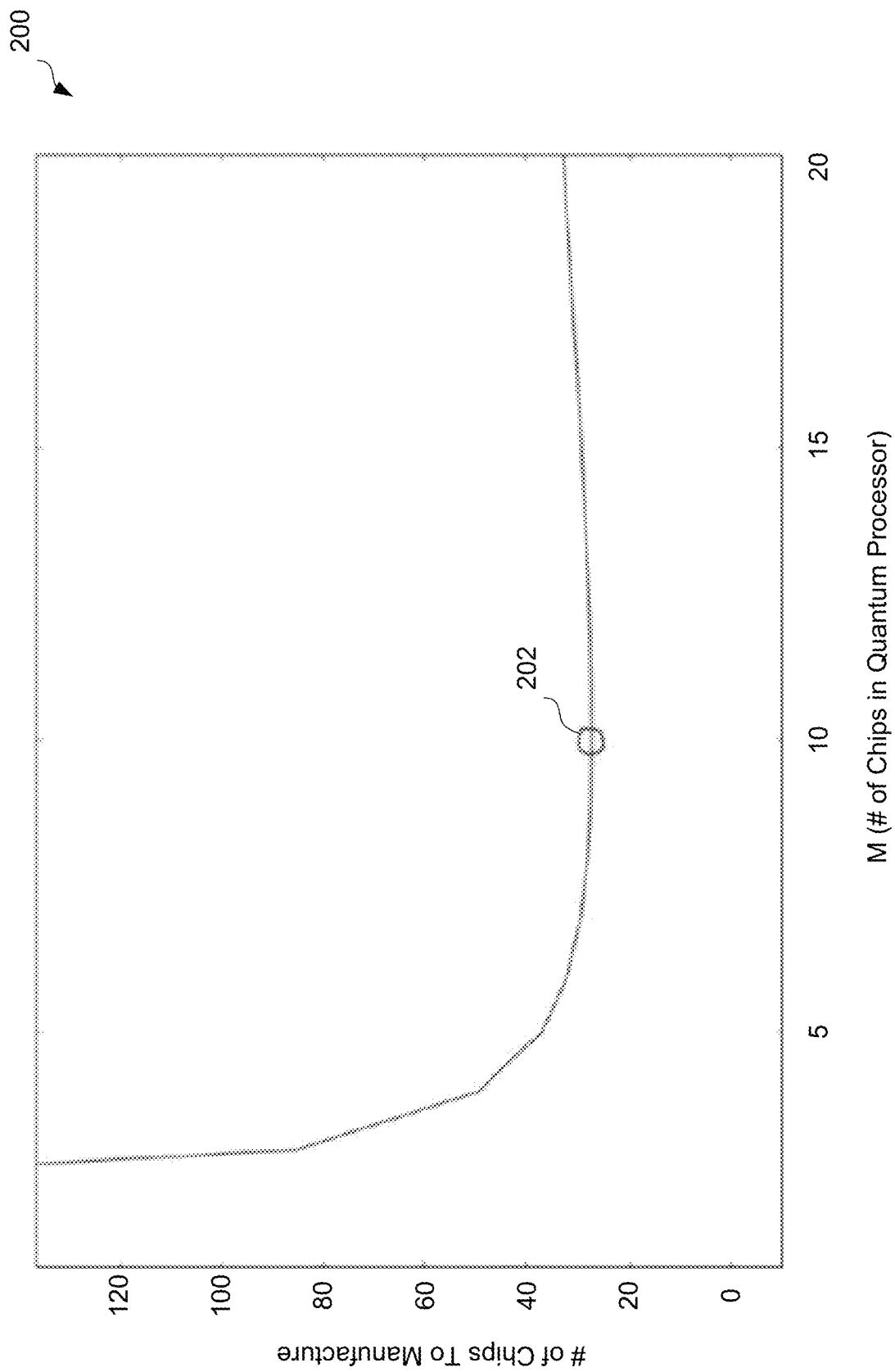
FIG. 2 is a plot showing an example relationship between a number of superconducting quantum circuit chips in a quantum processor and an expected number of superconducting quantum circuit chips manufactured to yield the desired number of chips.

FIG. 2 is a plot 200 showing an example relationship between a number (M) of superconducting quantum circuit chips in a quantum processor and an expected number of superconducting quantum circuit chips manufactured to yield the M number of chips. The relationship shown in the example plot 200 assumes that each qubit device has a probability p of being manufactured to specification (e.g., not having shorted or open Josephson junctions, having an energy spectrum close to the desired energy spectrum, having coherence times of sufficient length, etc.). A superconducting quantum circuit chip that includes N qubit devices will have all (i.e., N) of its qubit devices manufactured to specification with an overall probability of $p^N$. If $p<1$ and N is sufficiently large, this overall probability approaches 0. Likewise, the expected number of quantum circuit chips that need to be made in order to produce a chip with all working qubits is $1/p^N$, which goes to infinity as N goes to infinity.

Accordingly, instead of building one large monolithic quantum processor with N qubit devices on a single chip, a quantum processor may include M smaller quantum circuit chips (M<N), with N/M qubits each (on average). The chips can be manufactured and tested separately, and since $p^{(N/M)} \gg p^N$ when $M \gg 1$, these smaller chips with N/M qubits may have increased yields, making their manufacturing more efficient. In some implementations, the M small chips may be arranged in a larger structure such as, for example, the types of structures shown in FIGS. 3A, 3B, 3C, 3D, 4A, 4B, 5A and 5B, or another type of structure.

Where multiple small chips are used, the expected number of chips that need to be fabricated to assemble a modular quantum computer with N qubits is $M/p^{(N/M)}$. Minimizing this function with respect to M (considering M as a continuous variable for a moment), yields an optimal value of $M^*=N^*\log(1/p)$, and the expected number of chips manufactured is $M^*/p^{(N/M^*)}=N^*e^*\log(1/p)$. Accordingly, in some cases, the optimum choice for M may be either the floor or ceiling of M*, and the true expected number of chips may be very close to $N*e*\log(1/p)$ (a linear function of N rather than an exponential function of N). For example, consider a scenario where N=1000 and p=0.99. If a monolithic architecture is used, on average, $1/p^N=23163.5$ chips will need to be manufactured to create the quantum computer with all N components working correctly. The example plot 200 shows the relationship of the function $M/p^{(N/M)}$ as a function of M, where the optimal number of chips to use is M=10 (shown by point 202 in the plot 200), and the average number of chips that will need to be made is 27.3 in this example.

Accordingly, by implementing a modular architecture (e.g., similar to those shown in FIGS. 3A-3D, 4A-4B, and 5A-5B), the number of chips that are fabricated to acquire N working qubits (given a fixed qubit fabrication success probability p) may be reduced (e.g., exponentially in some cases). In addition, the need for superconducting vias and superconducting interposer structures in the chips that include quantum circuit devices may be reduced, for example, by incorporating such structures elsewhere (e.g., in the PCB 302 or caps 306 shown in FIG. 3A).

Furthermore, a modular chip bring-up/development scheme may be more efficient than what is possible for monolithic chip architectures. For instance, each modular chip can be fully characterized and tested and put through quality assurance before being integrated into a large quantum processor. Once placed in the larger architecture, the smaller chip can be re-characterized and predictions of chip-to-chip isolation and theoretical corrections due to the introduced coupling can be tested in-situ. With the fabrication capability of bonding and de-bonding the chips with other structures in the quantum processor, it might also be possible to recycle the chips as they age and their qualities drift out of specification (e.g., since very slow fluctuations in frequency and coherence have been observed in superconducting qubits).

Moreover, modular architectures and corresponding modular chip quality assurance and assembly schemes may save time and computational resources in the chip characterization process, as well as saving time and other resources for assembling high- quality quantum processors. In addition to scalability of fabrication processes, the modular architectures described here may allow for the flexibility of using separate chips for specific purposes within a quantum processor. For example, tunable-frequency qubit devices that have more flexible control characteristics may be implemented on one chip (or on one group of chips) for computations and application of quantum logic; and fixed-frequency qubit devices that have longer relaxation times may be implemented on another chip (or on another group of chips) for readout operations.

Figure 3A:
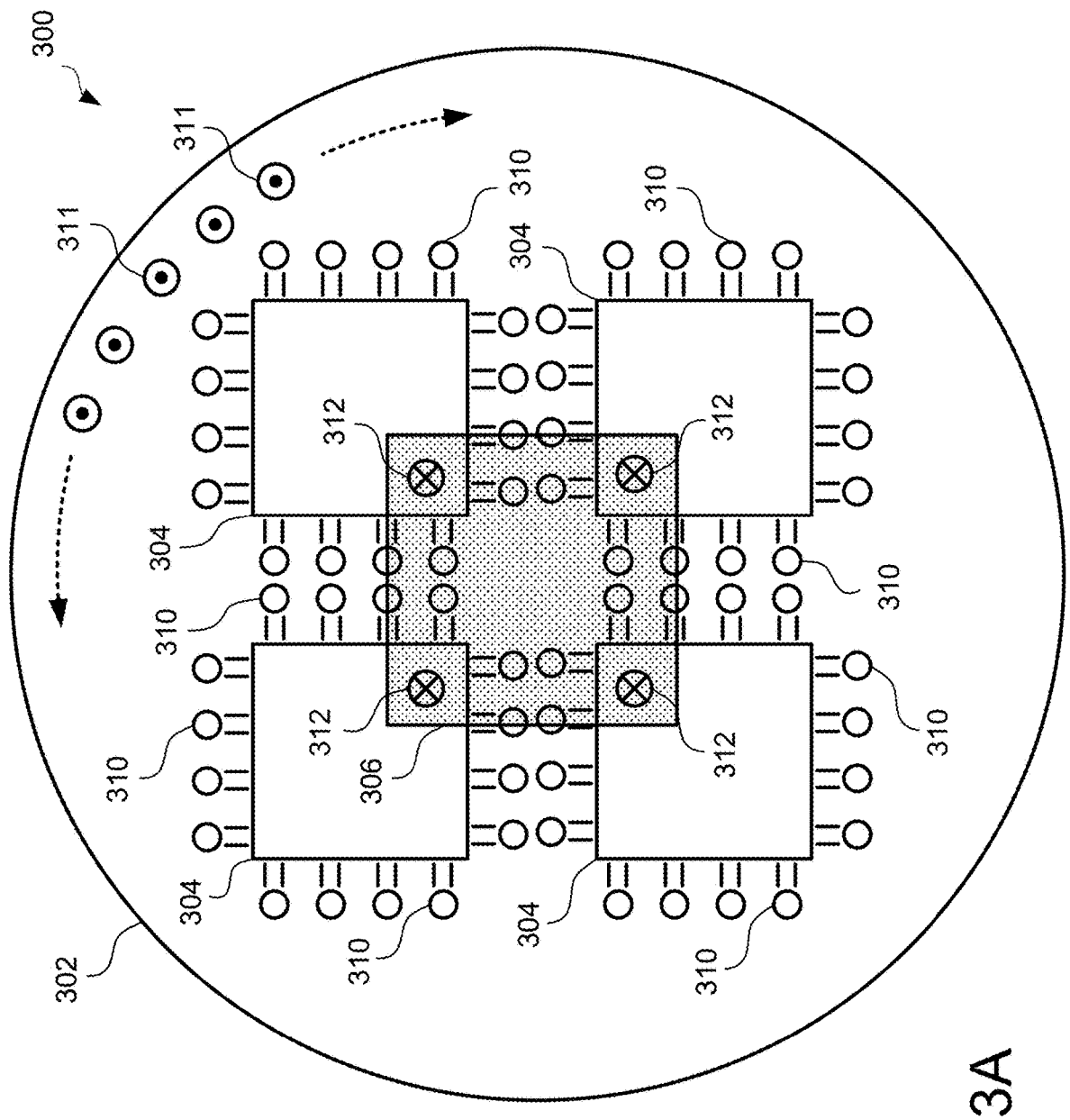
FIG. 3A is a diagram of an example modular superconducting quantum processor that includes four superconducting quantum circuit chips on a printed circuit board (PCB).

FIG. 3A is a diagram of an example modular superconducting quantum processor 300 that includes four superconducting quantum circuit chips 304 on one printed circuit board (PCB) 302. The superconducting quantum circuit chips 304 each include multiple quantum circuit devices, such as, for example, multiple qubit devices, resonator devices, coupler devices, etc. The chips 304 are supported on the PCB 302, and a cap 306 is supported on the chips 304. In other words, the chips 304 are sandwiched between the PCB 302 and the cap 306. The cap 306 is transparent in FIG. 3A for the purpose of illustration to show the position of the cap relative to the quantum circuit chips 304 below and also to show all of the connectors 310.

The example superconducting quantum circuit chips 304 communicate with other components via connections in the cap 306 and the PCB 302. The signaling connections may be implemented, for example, as superconducting traces, transmission lines, or other types of structures. In the example shown, the superconducting quantum circuit chips 304 are coupled to one another through the connections in the cap 306, and the superconducting quantum circuit chips 304 are coupled to external systems through the connections in the PCB 302. The chips 304 may be interconnected or connected to other types of components in another manner.

In some cases, the processor 300 includes additional chips 304. For example, the PCB 302 may support a two-dimensional array of chips 304 of the same type or of different types, and each chip 304 can be coupled to its nearest neighbors by a set of one or more caps 306. In such cases, a single chip 304 may support multiple caps 306 to provide connections to multiple groups of other chips. For example, in a square or rectangular two-dimensional array of chips, each chip 304 may be surrounded by as many as eight immediately neighboring chips, and multiple caps 306 may be used to connect an individual chip 304 to some or all of its immediately neighboring chips. For instance, a single chip 304 may be connected to two, three, or four caps 306, where each cap 306 connects the chip 304 to a respective group of other chips.

In some implementations, a number (M) of small chips 304 may be arranged on a larger monolithic PCB 302 that has connectors 310 or other structures to connect with each chip. The PCB 302 can include vias surrounding each chip that can be used for three-dimensional signal delivery or to isolate distinct chips 304 from one another. These chips 304 can then be coupled together using a single superconductor-patterned silicon cap covering all M chips, several superconductor-patterned silicon caps covering only a few chips each, wirebonds, ribbon bonds, or other types of structures.

In the example shown in FIG. 3A, the superconducting quantum circuit chips 304 are coupled to the PCB 302 by connectors 310 on the surface of the PCB 302. Each of the connectors 310 is connected (e.g., by a signal lines, vias, or other types of structures in the PCB 302) to a respective port 311 near the perimeter of the PCB 302. The ports 311 and connectors 310, and the signal lines that connect each of the ports 311 to a respective one of the connectors 310, are used to communicate signals between the chips 304 and an external system. For example, the quantum processor 300 in FIG. 3A can be deployed as the quantum processor 102 shown in FIG. 1, and the ports 311 in FIG. 3A can be connected to the signal delivery system 106 of FIG. 1.

Figure 3B:
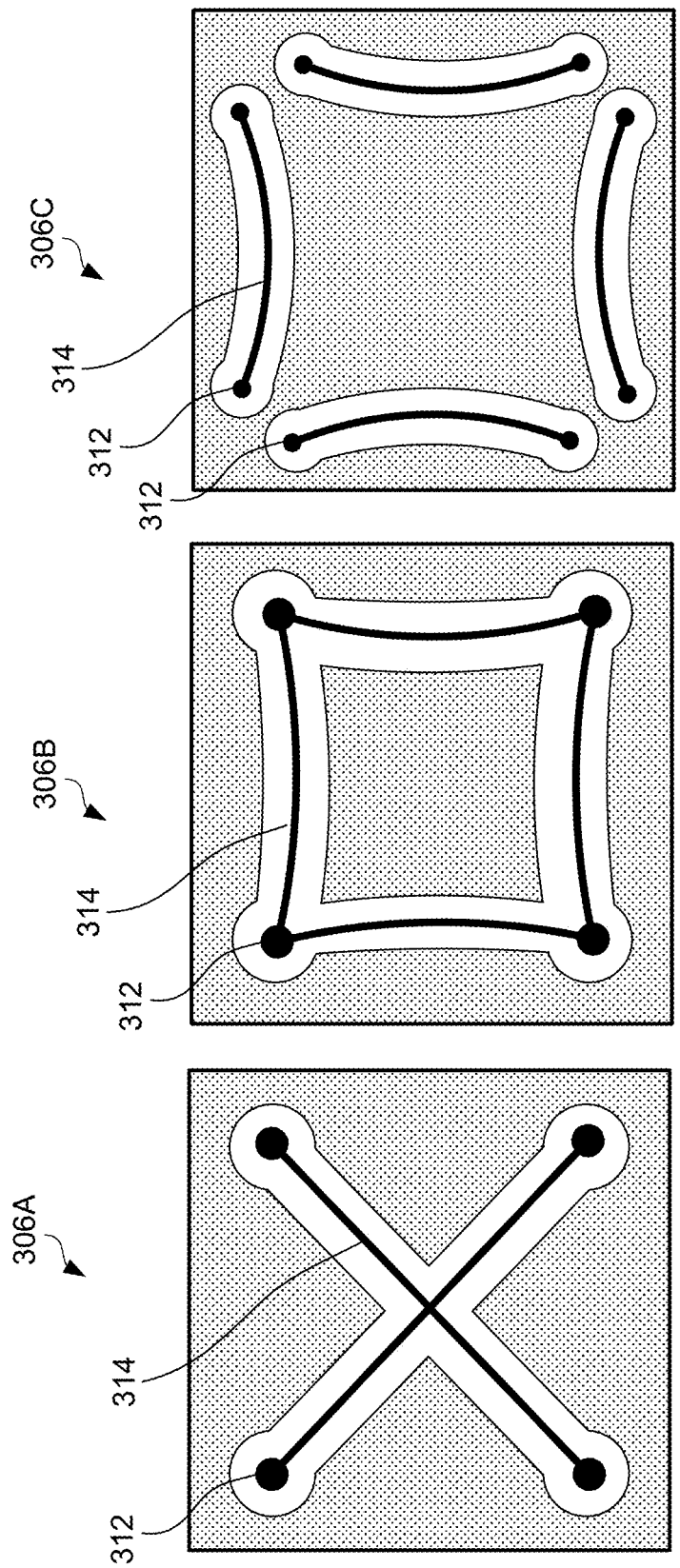
FIG. 3B are diagrams of example caps that can be used to couple the superconducting quantum circuit chips in FIG. 3A.
Figure 3C:
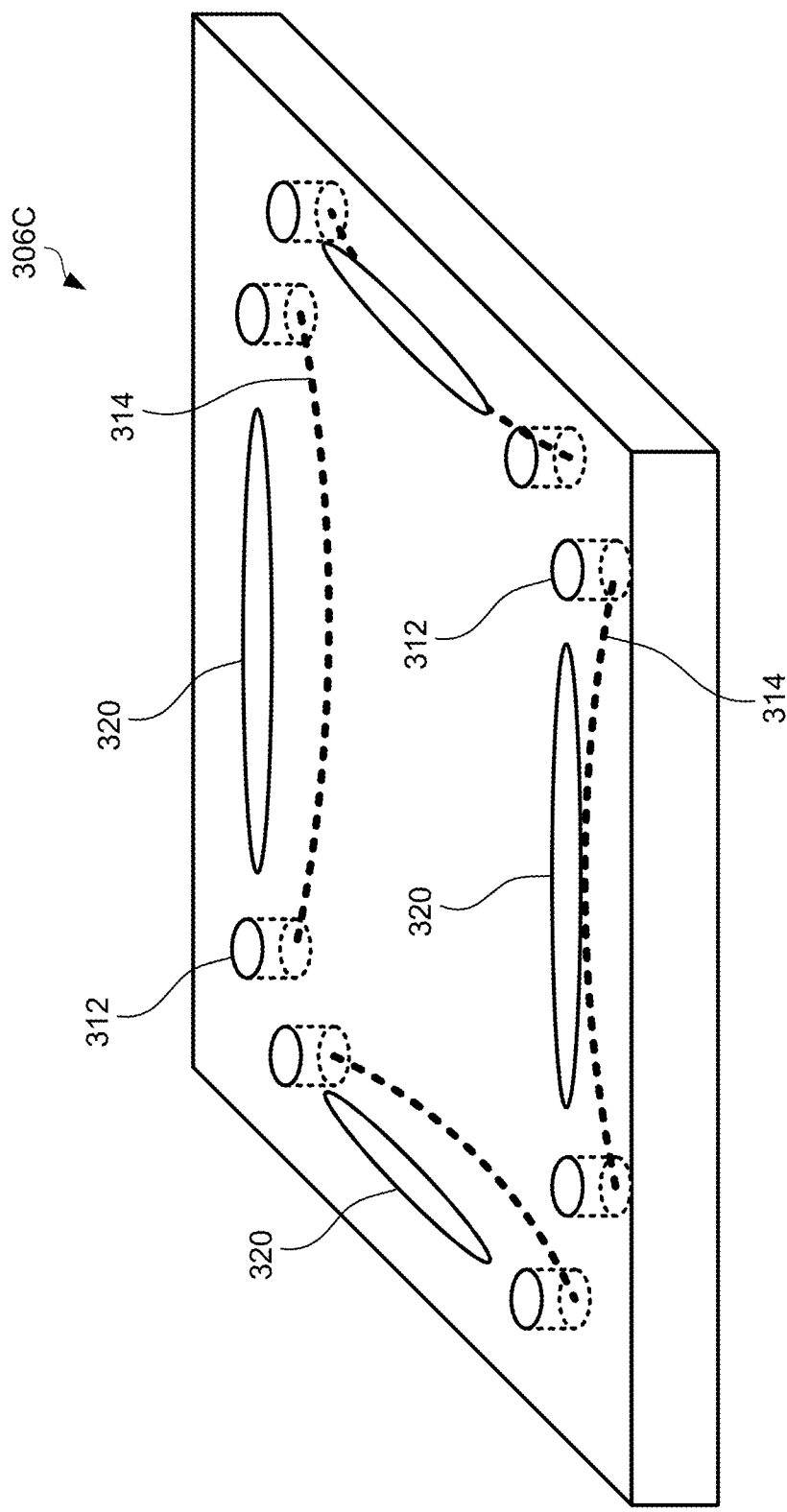
FIG. 3C is a diagram showing a perspective view of the example cap 306C of FIG. 3B.
Figure 3D:
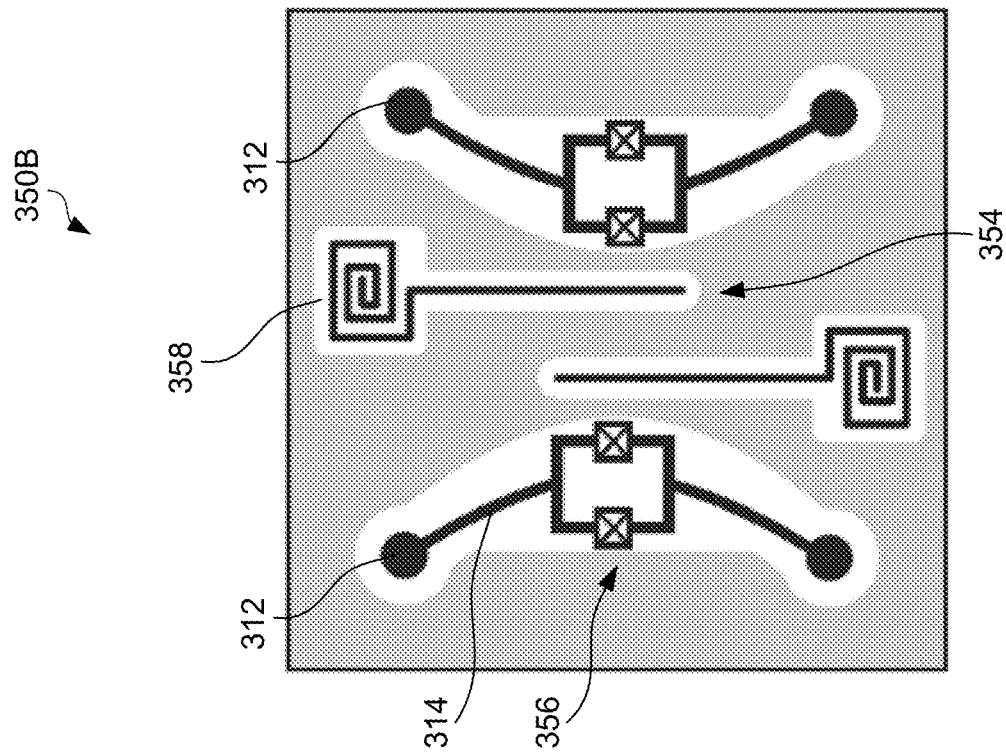
FIG. 3D are diagrams of example caps that can be used to couple the superconducting quantum circuit chips in FIG. 3A.
Figure 3D:
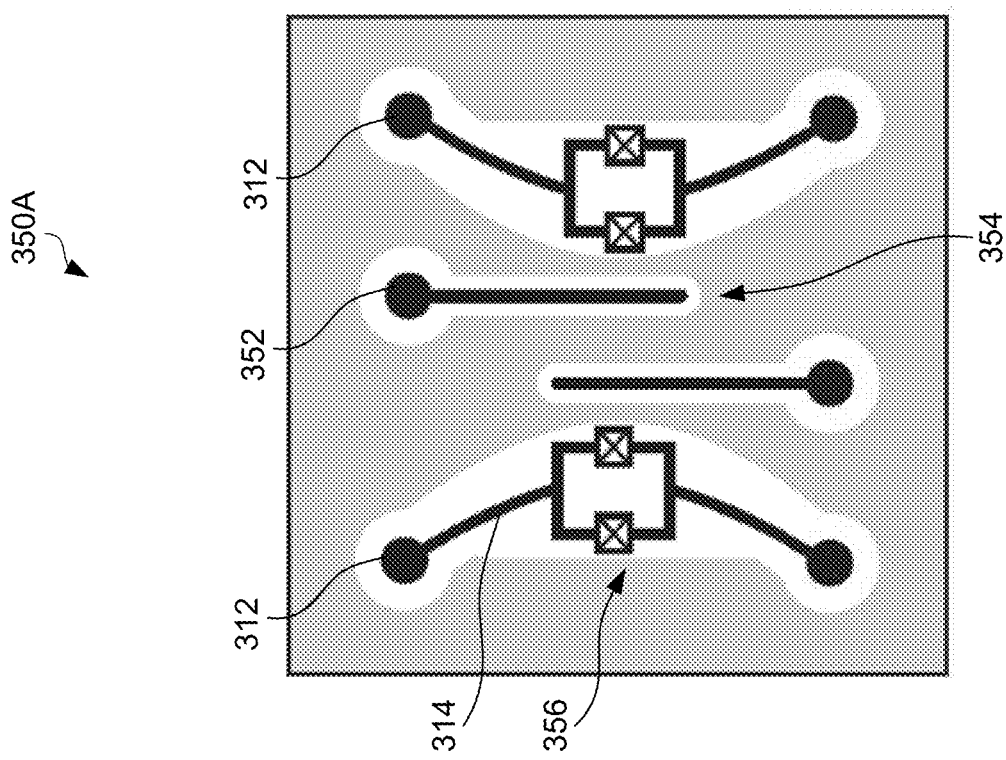

In the example shown in FIG. 3A, the superconducting quantum circuit chips 304 are coupled to the cap 306 by bonds 312. The bonds 312 may be implemented with a superconducting material (e.g., Indium or other types of materials). In some implementations, the superconducting quantum circuit chips 304 are communicably coupled to the cap 306 by galvanic, capacitive or inductive coupling. The cap 306 includes signal lines that are connected to the bonds 312 and provide communication between the chips 304. Examples of signal lines that may be provided between the bonds 312 in the cap 306 are shown in FIGS. 3B, 3C and 3D. In some cases, the cap 306 is used to couple the superconducting quantum circuit chips 304 of the PCB 302 in a three-dimensional manner. For instance, the signal lines in the cap 306 may couple the superconducting quantum circuit chips 304 on the PCB 302 to components of a quantum processor on another PCB (e.g., one that is located above or below the PCB 302).

FIG. 3B are diagrams of example caps 306A, 306B, 306C that can be used, for example, as the cap 306 shown in FIG.

3A, to couple devices on distinct superconducting quantum circuit chips. The example cap 306A includes traces 314 that connect the bonds 312 in an X-shaped pattern, where each bond 312 is connected to the other bonds 312 by an intersection of the traces 314 near the middle of the cap 306. The example cap 306B includes traces 314 that connect the bonds 312 together in a ring manner, where each bond 312 is connected to the bonds 312 at neighboring corners of the cap 306 (e.g., the top left bond 312 is connected to the top right bond 312 and the lower left bond 312). The example cap 306C includes traces 314 that connect respective pairs of the bonds 312. As shown in FIG. 3C, each bond 312 in the example cap 306C is connected to one other bond 312 at a neighboring corner of the cap 306C.

The example caps 306A, 306B each include four bonds 312, which provides a single bond 312 for each respective chip 304 in FIG. 3A. In these examples (306A, 306B), an individual bond 312 provides communication (through the traces 314) between multiple pairs of chips. The example cap 306C includes eight bonds 312, which provides two bonds 312 for each respective chip 304 in FIG. 3A. In this example (306C), an individual bond 312 provides communication (through an individual trace 314) between a single pair of chips. The traces 314 may be implemented in a coplanar waveguide topology, a microstrip waveguide topology, or another topology for microwave communication.

FIG. 3C is a diagram showing a perspective view of the example cap 306C of FIG. 3B. In the example shown in FIG. 3C, the cap 306C includes the bonds 312 and traces 314 shown FIG. 3B, and the bonds 312 are connected to the traces 314 by vias that extend vertically through the cap 306C. The cap 306C shown in FIG. 3C may also include metallized oxide bumps or other electrically conducting bonds 320, which may be used to connect a ground plane of the cap 306 to a ground conductor on the PCB 302. The bonds 312 and the oxide bumps or other electrically conducting bonds 320 may have a thickness, for example, on the order of tens of µm (micrometers) in some instances.

FIG. 3D are diagrams of example caps 350A, 350B that can be used, for example, as the cap 306 shown in FIG. 3A, to couple devices on distinct superconducting quantum circuit chips. The example caps 350A, 350B each include traces 314 and active coupler devices 356 that connect respective pairs of the bonds 312. As shown in FIG. 3D, each bond 312 in the example caps 350A, 350B is connected to one other bond 312 at a neighboring corner of the cap. The active coupler devices 356 may be implemented, for example, by tunable resonator devices (e.g., by tunable transmon devices or other types of tunable resonators). In the examples shown in FIG. 3D, each active coupler device includes a circuit loop with two Josephson junctions; an active coupler device may be implemented in another manner (e.g., using another circuit topology or configuration, etc.)

The example caps 350A, 350B shown in FIG. 3D also include control lines configured to activate or deactivate the active coupler devices 356. Each of the control lines includes a respective flux bias device 354 that can generate a magnetic flux, and the magnetic flux generated by a control line can be controlled to activate or deactivate the neighboring active coupler device 356. For example, the active coupler device 356 may include a circuit loop that is positioned to receive at least a portion of the magnetic flux generated by the associated flux bias device 354. Each control line includes an input port 352, 358 that can receive the coupler device control signal that controls the magnetic flux that activates or deactivates the associated coupler device 356. The example input port 352 in the cap 350A has a galvanic connection to an input signal line (not shown); the example input port 358 in the cap 350B has an inductive connection to an input signal line (not shown).

In some aspects of operation, the magnetic flux generated by a control line tunes a resonance frequency of the associated active coupler device 356. The resonance frequency of the active coupler device 356 may be tuned to an active state, for example, a state that activates coupling between qubit devices on different quantum circuit chips. Or the resonance frequency of the active coupler device 356 may be tuned to an inactive state, for example, a state that deactivates coupling between qubit devices on different quantum circuit chips.

The example caps 350A, 350B each include four bonds 312, which provides a single bond 312 for each respective chip 304 in FIG. 3A. In these examples (350A, 350B), an individual bond 312 provides communication (through the traces 314 and an active coupler device 356) between a single pair of chips. The traces 314 may be implemented in a coplanar waveguide topology, a microstrip waveguide topology, or another topology for microwave communication.

In the example caps shown in FIGS. 3B and 3D, the bonds 312 provide a galvanic connection between the cap structure and one of the quantum circuit chips. In some cases, the bonds 312 can be replaced by other types of signal connections between the cap structure and the quantum circuit chip. For example, the caps 350A, 350B may have any combination of galvanic connections, inductive connections or capacitive connections between the active coupler devices 356 and the respective quantum circuit chips.

Figure 4A:
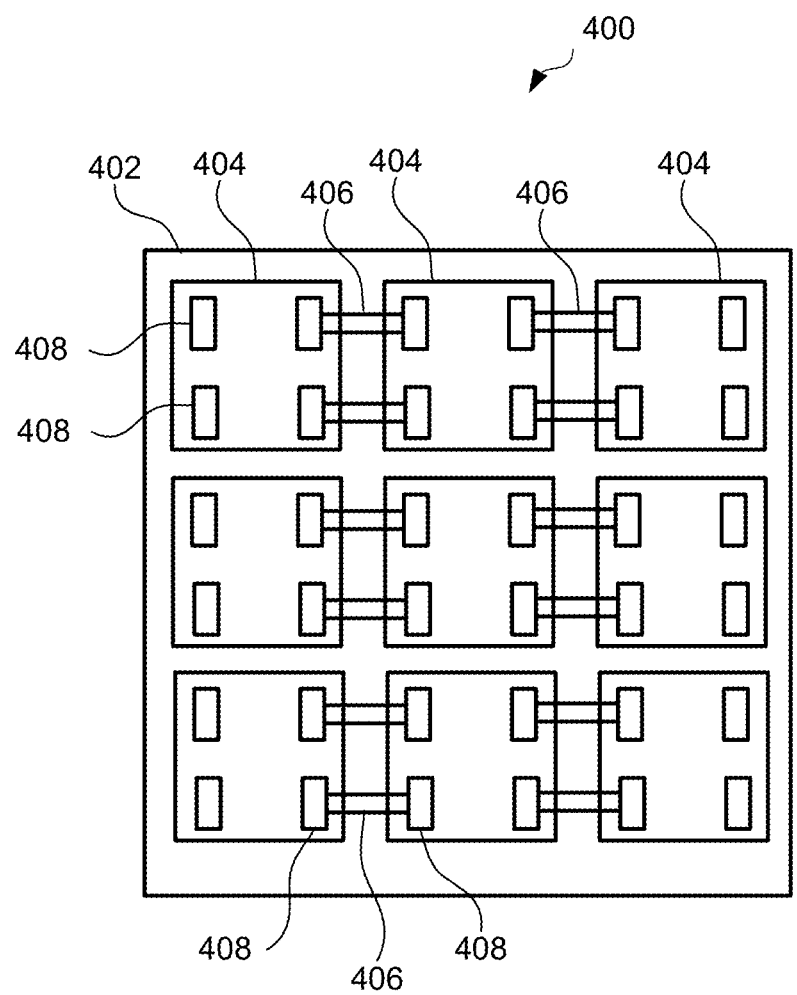
FIGS. 4A-4B are diagrams of another example modular superconducting quantum processor that includes multiple superconducting quantum circuit chips on a substrate.
Figure 4B:
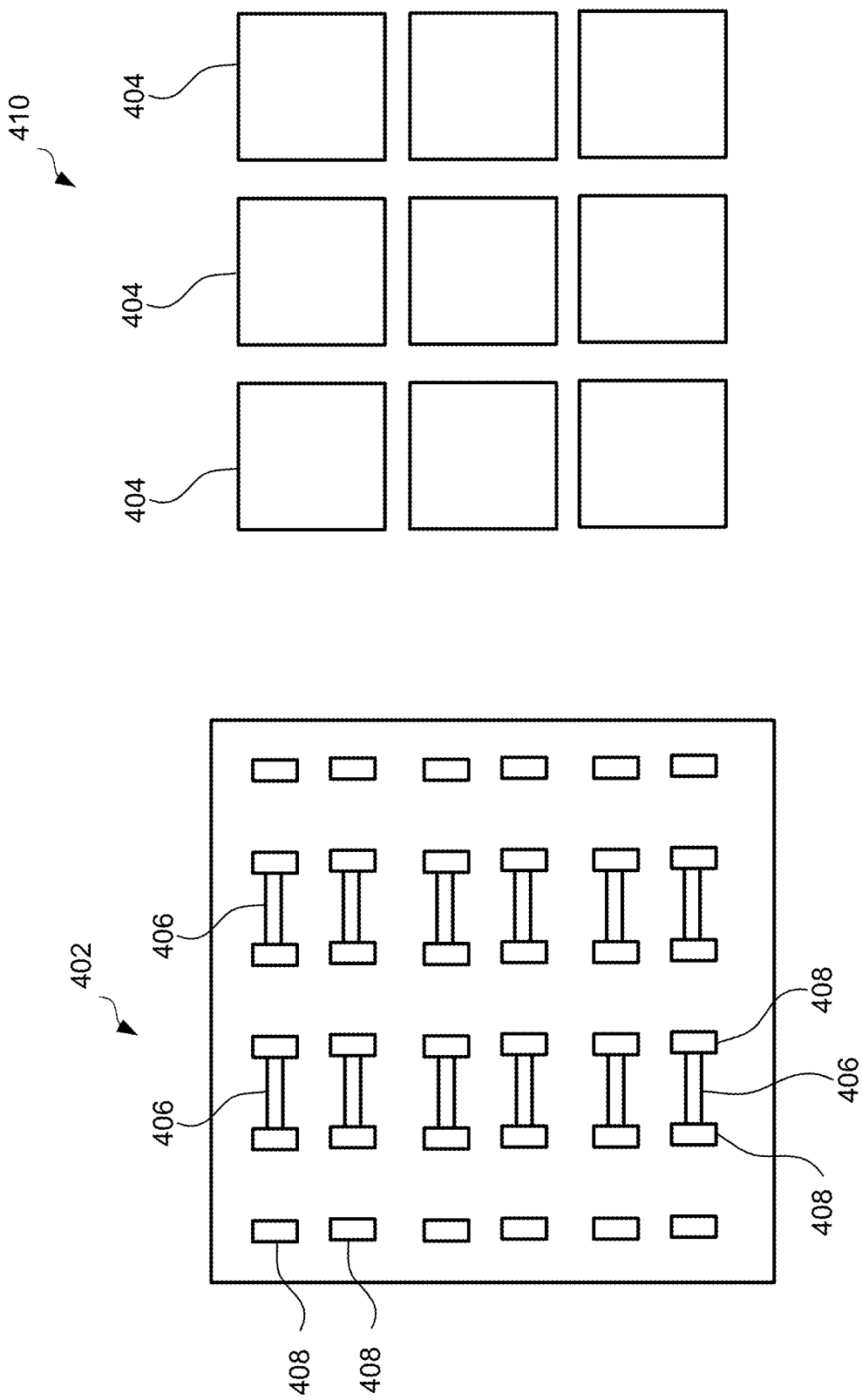

FIGS. 4A-4B are diagrams of another example modular superconducting quantum processor 400 that includes multiple superconducting quantum circuit chips 404 on a substrate 402. The superconducting quantum circuit chips 404 each include multiple quantum circuit devices, such as, for example, multiple qubit devices, resonator devices, coupler devices, etc. The substrate 402 can be a crystalline substrate (e.g., silicon or sapphire), another type of substrate (e.g., fused silica or fused quartz) or a substrate layer as described above.

In the example shown in FIG. 4A, the superconducting quantum circuit chips 404 are coupled to one another via transmission lines 406 on the substrate 402. The transmission lines 406 may be implemented as superconducting traces or other types of structures. The example superconducting quantum circuit chips 404 may communicate with other components of the quantum processor via bond pads 408 on the substrate 402 or other types of connections. The bond pads 408 may be implemented as a superconducting material, or in another manner.

In some cases, the transmission lines 406 are routed three-dimensionally through the substrate 402 (e.g., through all or part of the thickness of the substrate 402), allowing for arbitrary connectivity architectures. The substrate 402 may also include circuit devices and other circuit elements, which can be of the same type as the circuit devices on the chips 404 (e.g., qubit devices, readout devices, etc.). The bond pads 408 on the substrate 402 may be arranged such that N number of smaller chips 404 can be placed and bonded with good electrical contact and micron-scale alignment accuracy. Signal lines to the chips 404 may be arranged such that wirebonds (or some other technique to make electrical contact) can connect the resonators of the chips 404 to external sources after the chips 404 have been bonded to the substrate 402 (via the bond pads 408).

FIG. 4B shows the superconducting quantum circuit chips 404 at 410 apart from the substrate 402, for example, not yet assembled to the substrate 402. To manufacture the modular superconducting quantum processor 400, the superconducting quantum circuit chips 404 may be positioned on the surface of the substrate 402 and assembled to the substrate 402 by bonding them to the bond pads 408. FIG. 4A shows the superconducting quantum circuit chips 404 assembled to the substrate 402, having been bonded to the bond pads 408 on the surface of the substrate 402. The superconducting quantum circuit chips 404 are transparent in FIG. 4A for the purpose of illustration to show their position on the substrate 402 relative to the bond pads 408 and transmission lines 406.

FIG. 5A is a diagram of a modular quantum processor 500 that includes multiple quantum circuit chips 504 coupled to one another via resonator buses 506. The example modular quantum processor 500 is coupled to and communicates with control electronics 510. Each of the example quantum circuit chips 504 in FIG. 5A include eight (8) qubit devices 501 (represented in FIG. 5A by circles) and eight (8) resonator devices 502 (represented in FIG. 5A by triangles), with each qubit device coupled to a respective one of the resonator devices.

The qubit devices of the quantum circuit chips 504 may include fixed-frequency transmon qubit devices, tunable transmon qubit devices, fluxoniums qubit devices, another type of qubit device, or combinations of thereof. The qubit devices on the same quantum circuit chip 504 may be connected to one another via transmission lines on the quantum circuit chips 504. The connectivity of the quantum circuit chips 504 can be arranged in either a planar geometry or in a three-dimensional geometry. The coupling resonators in the resonator buses 506 are used for exchanging information or mediating entanglement between the respective quantum circuit chips 504. In the example shown, the resonator buses 506 include a series of resonators arranged as resonator buses, tunable couplers, etc.

The example control electronics 510 can include data processors, signal generators, interface components and other types of systems or subsystems. For instance, the control electronics 510 may include some or all of the components of the example control system 110 shown in FIG. 1, and may communicate with the modular quantum processor 500 as the control system 110 communicates with the quantum processor 102 in the example shown in FIG. 1, or in another manner. In some cases, the control electronics 510 includes a microwave signal source (e.g., an arbitrary waveform generator), a bias signal source and other components that generate control signals to be delivered to the circuit chips 504 via the resonator buses 506.

In some cases, each of the resonator buses 506 is implemented as a multi-mode resonator bus that allows selective coupling between pairs of devices on distinct chips 504. For instance, an individual qubit device on one of the chips 504 can be selectively coupled to an individual qubit device on another one of the chips 504 through the resonator bus 506, without affecting other qubit devices on either of the chips 504. The selective coupling can be accomplished, for example, by activating an individual mode of the resonator bus 506 that couples the pair of qubit devices based on the respective energy levels of the qubit devices. In some cases, multiple pairs of qubit devices can interact in parallel.

In the example shown in FIG. 5A, parametrically modulating the frequencies of the qubit devices on the quantum circuit chips 504 may be used to create entanglement between the qubits on the same chip 504, to implement photon exchange between qubit devices and coupler devices, to create entanglement between qubits across different chips 504, or for other purposes. In some cases, creating entanglement between devices on the same chip 504 (e.g., two qubit devices, two resonator devices, or a resonator device and a qubit device) may be accomplished using non-parametric methods. In some instances, the architecture shown in FIG. 5A uses a parametric coupling technique to communicate between the qubits on separate chips 504 in a memory structure.

Figure 5B:
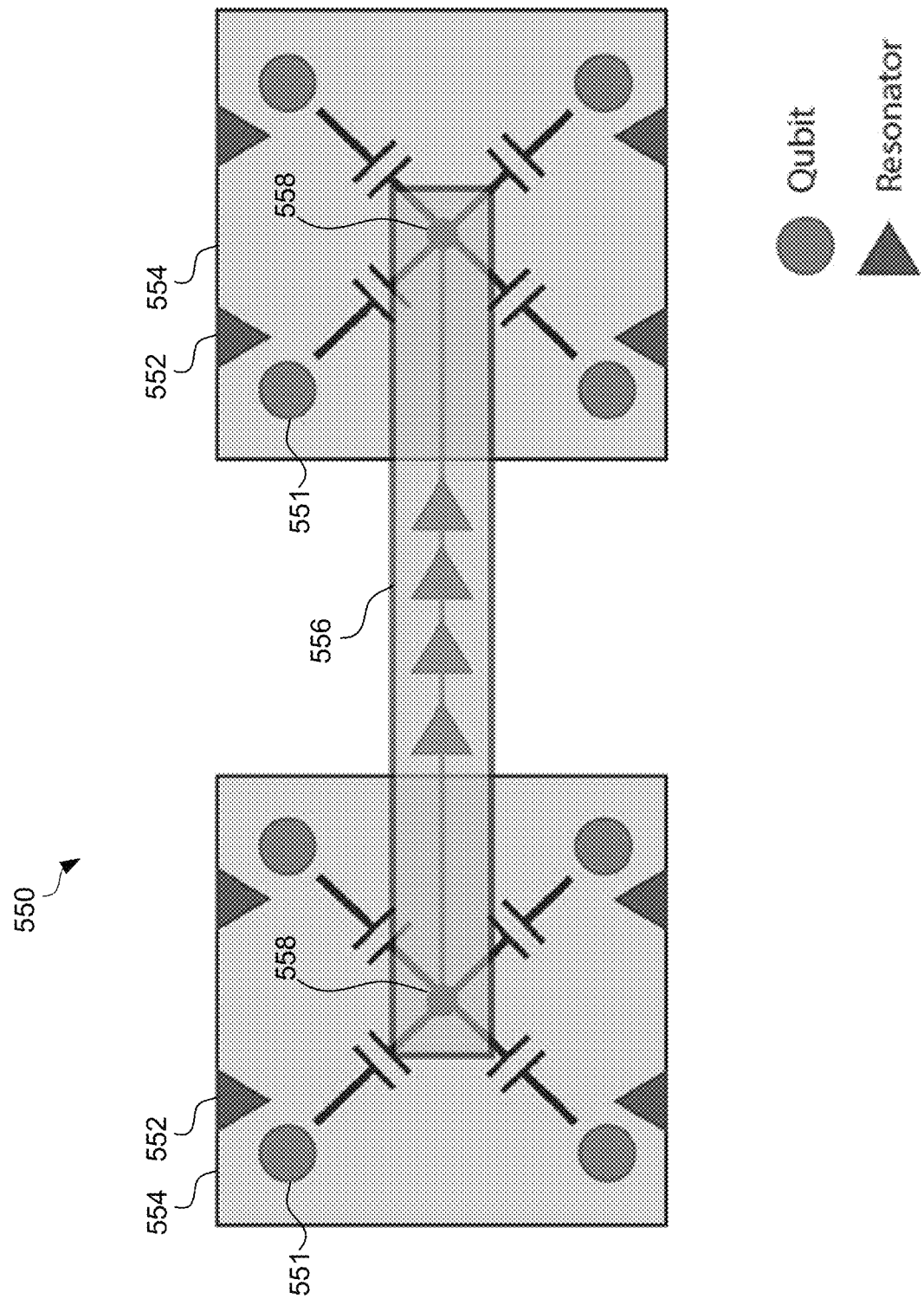
FIG. 5B is a diagram of a modular quantum processor that includes two quantum circuit chips coupled to one another by a resonator bus.

FIG. 5B is a diagram of a modular quantum processor 550 that includes two quantum circuit chips 554 coupled to one another by a resonator bus 556. The example modular quantum processor 550 is similar to the example modular quantum processor 500 shown in FIG. 5A and may operate in a similar manner. Each of the example quantum circuit chips 554 in FIG. SB include four (4) qubit devices 551 (represented in FIG. 5B by circles) and four (4) resonator devices 552 (represented in FIG. 5B by triangles), with each qubit device coupled to a respective one of the resonator devices.

The qubit devices of the quantum circuit chips 554 may include fixed-frequency transmon qubit devices, tunable transmon qubit devices, fluxoniums qubit devices, another type of qubit device, or combinations of thereof. As shown in FIG. 5B, the qubit devices in each quantum circuit chip 554 are capacitively connected to a central node 558 within the quantum circuit chip, and the central nodes of the quantum circuit chips 554 are connected to each other via the resonator bus 556. The capacitive connections in each quantum circuit chip 554 can provide coupling between the qubits within the same quantum circuit chip 554. The resonator bus 556 can provide coupling between the qubit devices in distinct quantum circuit chips 554. The resonator bus 556 and qubit devices shown in FIG. 5B can be configured as, and may operate similarly to, the example resonator buses 506 and qubit devices shown in FIG. 5A. For example, each individual qubit device may be selectively coupled to an individual qubit device in another quantum circuit chip by controlling the resonator bus 556 as described above.

Figure 6:
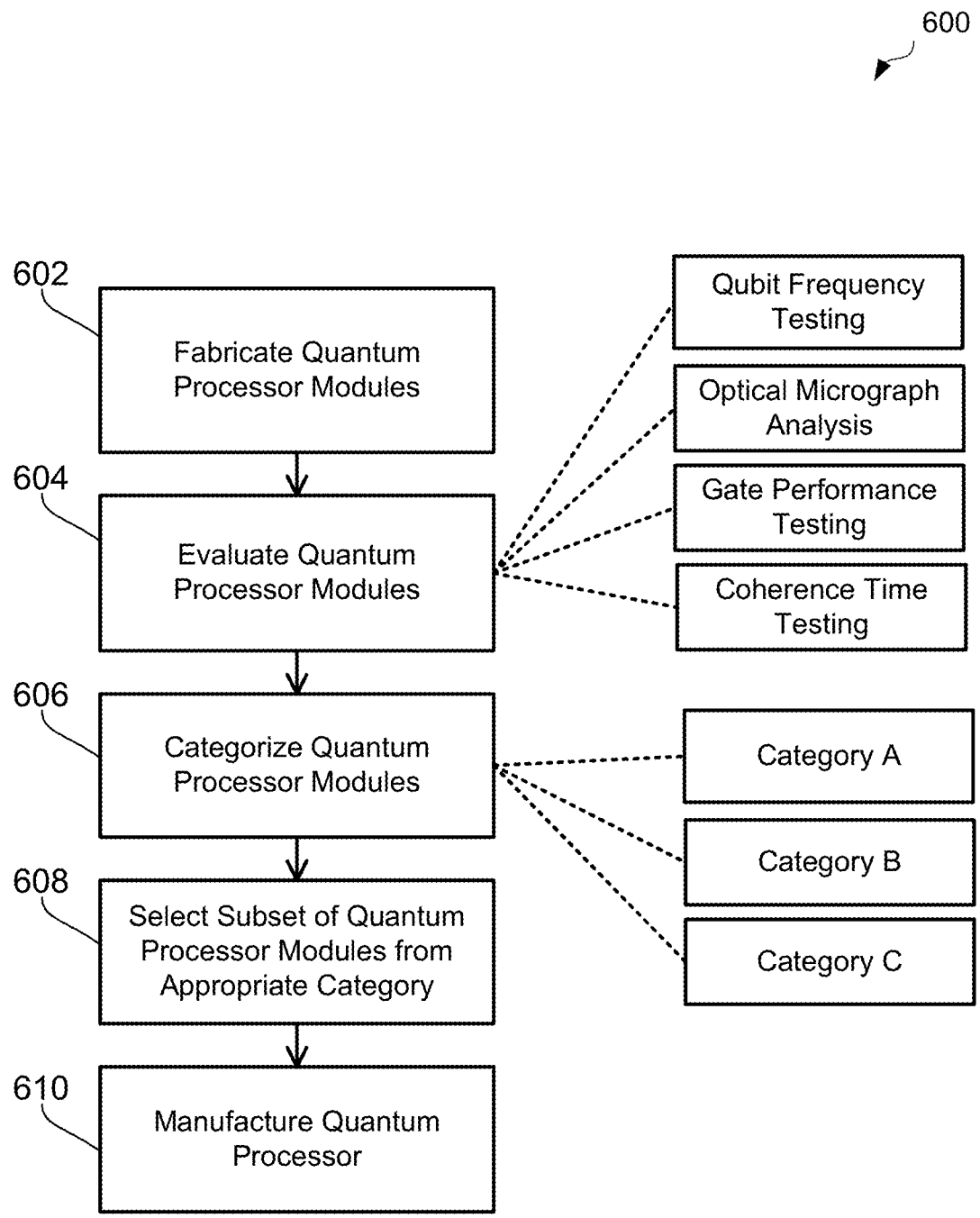
FIG. 6 is a flow diagram showing an example process of manufacturing a quantum processor.

FIG. 6 is a flow diagram showing an example process 600 of manufacturing a modular quantum processor. For example, the process 600 may be used to fabricate the example quantum processors and components shown in FIGS. 3A-3D, 4A-4B and 5A-5B, or another type of modular quantum processor. The example process 600 may include additional or different operations, and the operations may be performed in the order shown or in another order. In some cases, one or more of the operations shown in FIG. 6 are implemented as processes that include multiple operations, sub-processes, or other types of processes. In some cases, operations can be combined, performed in another order, performed in parallel, iterated, or otherwise repeated or performed in another manner.

At 602, quantum processor modules are fabricated. A quantum processor module can be quantum circuit chips that include one or more quantum circuit devices. For instance, each quantum processor module may include multiple qubit devices, readout resonator devices, Josephson junctions, or other quantum circuit devices. The quantum processor modules fabricated at 602 may include the chips 304 shown in FIG. 3A, the chips 404 shown in FIG. 4A, the chips 504 shown in FIG. 5A, or other types of quantum processor modules. In some implementations, each individual quantum processor module can function independently as a small quantum processor.

In some implementations, the quantum processor modules are fabricated in batches by a high-volume fabrication process. For instance, tens, hundreds, or thousands of quantum processor modules may be fabricated at 602 using the same fabrication process. In some cases, multiple different fabrication processes are used to produce a batch of quantum processor modules.

At 604, the quantum processor modules (fabricated at 604) are evaluated. As shown in FIG. 6, evaluating a quantum processor module may include qubit frequency testing, optical micrograph analysis, gate performance testing, coherence time testing, and other types of testing. The evaluations performed at 602 can be used to characterize the quantum processor module, for instance, to determine whether the quantum processor module performs according to its design specification.

In some implementations, the quantum processor modules are evaluated in batches by a high-volume testing process. For instance, tens, hundreds, or thousands of quantum processor modules may be evaluated at 604 using the same evaluation process. In some cases, multiple different evaluation processes are used to test a batch of quantum processor modules.

In some instances, the quantum processor modules are evaluated for qubit frequency information (e.g., the frequency difference between the ground state and first excited state), qubit anharmonicity information (e.g., based on the frequency difference between the first excited state and the second excited state) or other information that can be used to operate an individual qubit device. Qubit frequency information may be obtained using room temperature measurements, cryogenic measurements, or both. For example, qubit frequencies may be estimated within 100 MHz based on room temperature resistance measurements, and qubit frequencies may be more precisely measured at cryogenic temperatures. The qubit frequency may provide information about detunings and operating frequencies needed for other electronic components (e.g., signal delivery electronics).

In some instances, the quantum processor modules may undergo an optical micrograph analysis at 604. The optical micrograph analysis may detect fabrication errors (e.g., in trace widths and gaps). Examples of micrograph analysis may include detecting whether there are scratches present on a chip, whether there is visible contamination on a chip, or whether physical structures have appropriate sizes and connectivity (e.g., whether a coplanar waveguide inner conductor has appropriate width), and other types of analysis. Other types of criteria may be used, for example, depending on the physical architecture of the quantum processor modules.

In some instances, quantum logic gate performance is tested at 604. Quantum logic gate performance criteria may be tested at cryogenic temperatures (e.g., below 10 mK). In some cases, single-qubit performance characteristics such as, for example, single-qubit quantum logic gate fidelities and single-qubit quantum state readout fidelities, are evaluated. In some cases, multi-qubit performance characteristics such as, for example, two-qubit quantum logic gate fidelities are evaluated.

In some instances, coherence times of the qubit devices are tested at 604. For example, the techniques described with respect to FIGS. 7A-7C may be used to test the coherence time of a qubit device, or another type of measurement may be used.

At 606, the quantum processor modules are categorized based on the evaluations performed at 604. For example, the quantum processor modules may be sorted into multiple categories based on pre-determined criteria for each category. In some cases, the categories are indicative of a relative quality of the quantum processor module. For instance, the quantum processor modules may be categorized into categories A, B, C, where each category reflects an overall performance level of the quantum processor module. In some cases, the categories are indicative of a functionality of the quantum processor module, the number of working qubit devices in the quantum processor module, or a combination of these and other criteria.

In the example process 600 shown in FIG. 6, the evaluations performed on each quantum processor module at 604 are used to assign the quantum processor module to a respective category at 606 based on criteria associated with each category. As an example, the criteria associated with a category may include a range of acceptable values for the category (e.g., percent error from design for a particular test). The criteria associated with a particular category may be determined based on a designated use for that category. For instance, a first category may be defined for quantum processor modules to be used primarily for quantum readout or quantum memory, and the first category may require higher coherence times while accepting lower gate fidelities for certain types of quantum logic gates; a second category may be defined for quantum processor modules to be used primarily for quantum logic operations, and the second category may require higher gate fidelities for certain types of quantum logic gates while accepting shorter coherence times. The criteria associated with a particular category may be determined based on overall adherence to specification or other types of parameters.

As an example, Categories A, B and C shown in FIG. 6 can be defined using some or all of the following criteria, all of which may vary based on specific design criteria and hardware considerations:

Qubit frequency percent error from design:
    Category C: [−20%, 20%]
    Category B: [−5%, 5%]
    Category A: [−1%, 1%]
Qubit-qubit detuning/qubit-qubit coupling (unitless):
    Category C: >=10
    Category B: >=50
    Category A: >=100
Qubit-resonator detuning/qubit-resonator coupling (unitless) (may vary based on the use of Purcell filters or other factors)
    Category C: >=5
    Category B: >=25
    Category A: >=50
CPW inner conductor width error percentages according to:
    Category C: [−30%, 30%]
    Category B: [−10%, 10%]
    Category A: [−2%, 2%]
Through-substrate via yield:
    Category C: >50%
    Category B: >75%
    Category A: 100%
Single-qubit quantum logic gate fidelities:
    Category C: >99%
    Category B: >99.99%
    Category A: >99.9999%
Single-qubit quantum readout fidelities:
    Category C: >99%
    Category B: >99.99%
    Category A: >99.9999%

Two-qubit quantum logic gate fidelities:
  Category C: >99%
  Category B: >99.99%
  Category A: >99.9999%

Other types of criteria may be used, and the values shown above are provided only as one example. In the example above, Category A would be the highest performance category, since it is associated with the highest performance criteria for each test; Category C would be the lowest performance category, since it is associated with the lowest performance criteria for each test; Category B would be the intermediate performance category, since it associated with the intermediate performance criteria for each test.

In some cases, other types of components may be evaluated and categorized at 604 and 606. For example, the caps 306 shown in FIGS. 3A, 3B, 3C, 3D or the substrates 402 shown in FIGS. 4A and 4B may be evaluated and categorized. For instances, the caps 306 may be categorized according to cap room temperature, electrical conductivity (e.g., whether the cap is electrically conductive or not), and other types of properties.

At 608, a subset of the quantum processor modules is selected from appropriate categories determined at 606. The selection may be based on a specified performance level for the overall quantum processor. For example, where highest performance is desired for the quantum processor, only modules that were categorized into the highest performance category will typically be selected. As another example, where a quantum processor is to include different types of modules that perform different functions, each type of module may be selected from a different category.

At 610, a modular quantum processor is manufactured using the quantum processor modules selected at 608. The modular quantum processor may be manufactured according to one of the architectures described above with respect to FIGS. 3A-3D, 4A-4B, 5A-5B, or in another manner. In some cases, each of the quantum processor modules is physically attached to one or more integrated structures (e.g., the PCB 302 shown in FIG. 3A, the cap 306 shown in FIG. 3A, the substrate or substrate layer 402 shown in FIG. 4A, or another structure). The integrated structure can provide functional connections between distinct quantum processor modules as well as connections between the quantum processor modules and an external control system. In some examples, the integrated structure includes quantum circuit devices (e.g., the resonator buses 506, 556 shown in FIGS. 5A, 5B) or other types of structures that provide control over the interactions between devices (e.g., qubit devices) in distinct modules of the quantum processor.

After the modular quantum processor has been manufactured, the quantum processor module can be further characterized and tested. In some cases, the characterization and testing applied to the quantum processor can include the same types of evaluations performed at 604. In some cases, additional or different types of testing can be performed. For instance, the coupling between distinct quantum processor modules may be evaluated. Testing and characterization of the quantum processor may reveal that one or more of the quantum processor modules does not perform to specification, and such quantum processor modules may be individually removed and replaced in some cases.

After the modular quantum processor has been characterized and tested, the quantum processor can be deployed in a quantum computing system. For example, the quantum processor produced by the process 600 shown in FIG. 6 can be deployed as the quantum processor 102 in FIG. 1 or in another type of system. The modular quantum processor can utilize the quantum circuit devices in all of the quantum processor modules together. For instance, the qubit devices of each quantum processor module may be operated as a fully connected array of qubit devices, where each qubit device is connected (directly or indirectly) to all other qubit devices in the array (including qubit devices in other modules). In some cases, when the quantum processor module is operated, a coherent quantum state is defined over multiple quantum processor modules, for example, over qubit devices in all or part of the array.

Figure 7A:
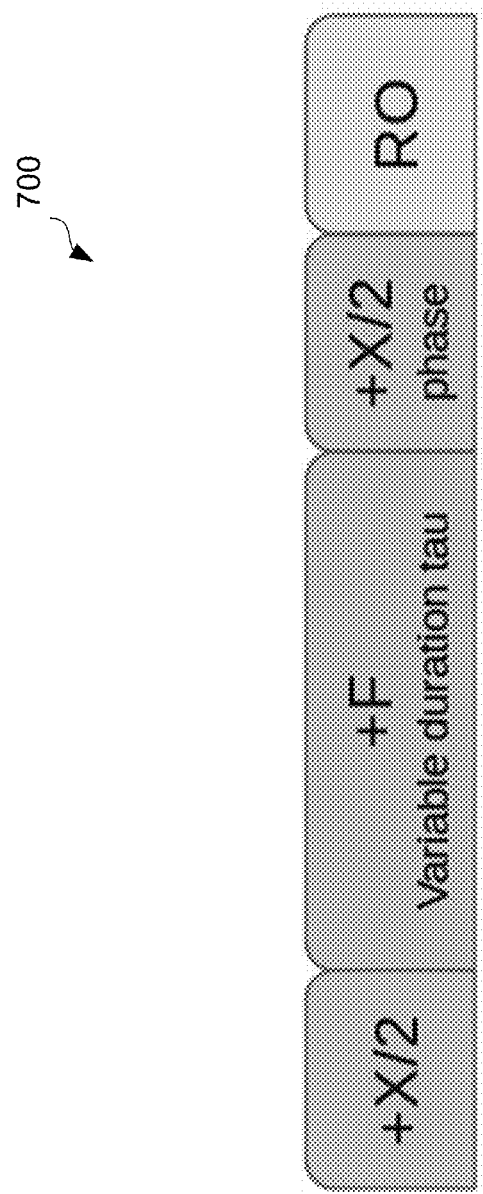
FIGS. 7A-7C are diagrams showing an example process for and data associated with measuring coherence times for qubit devices.
Figure 7B:
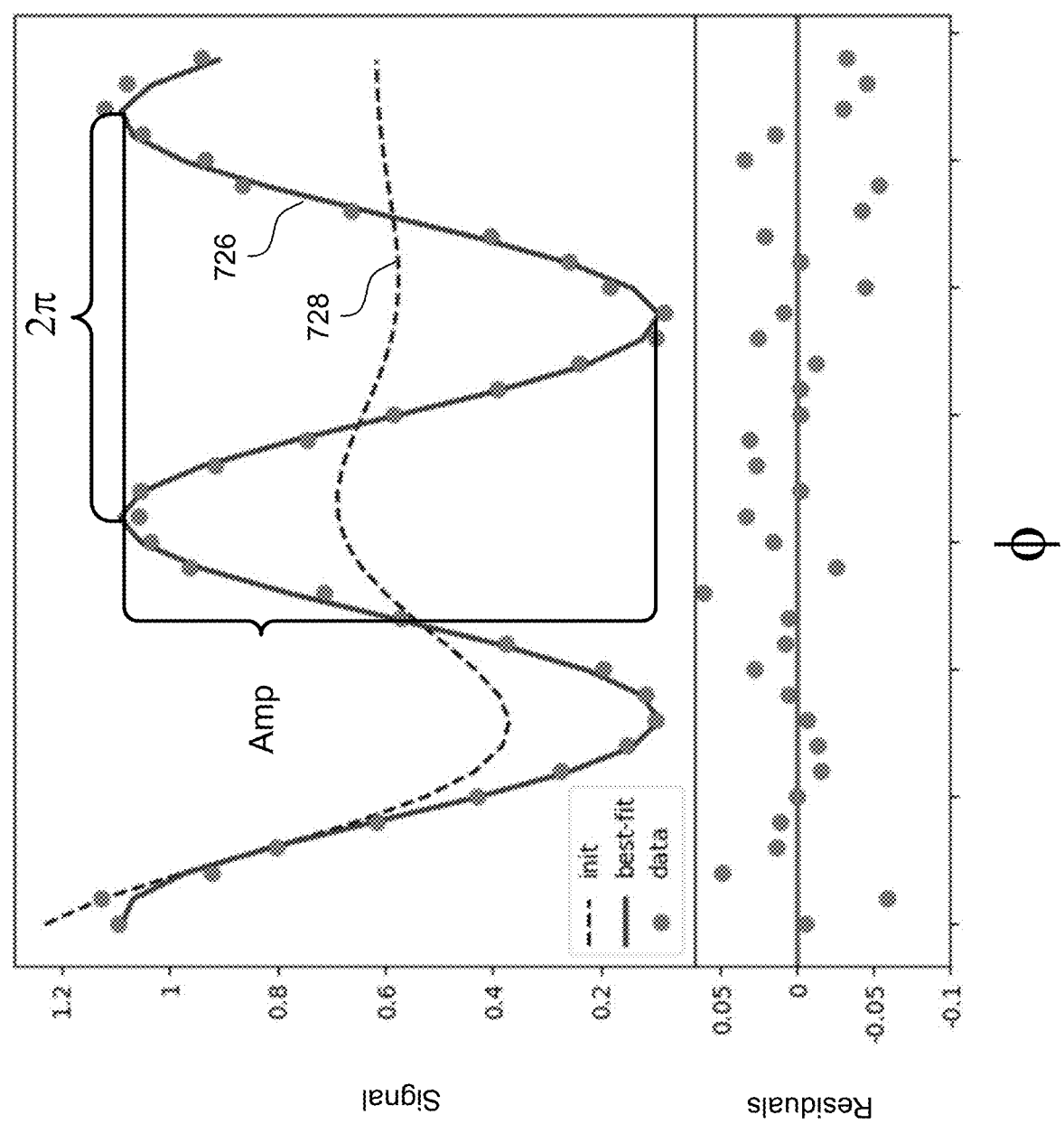
Figure 7C:
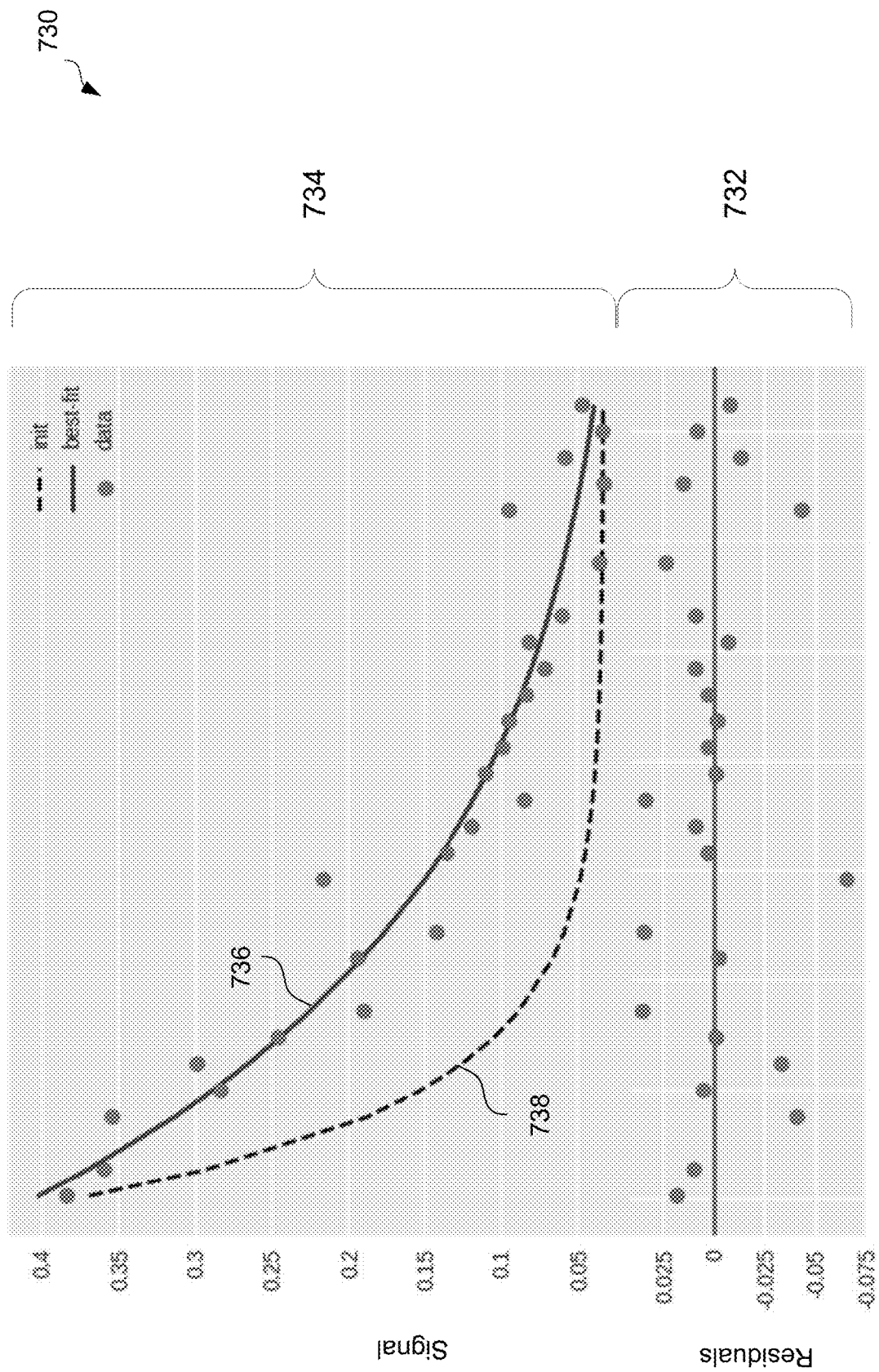

FIGS. 7A-7C are diagrams showing an example process for and data associated with measuring coherence times for qubit devices of a modular quantum processor. In some implementations, the measurement process measures a coherence time $T2^*$ of a qubit (which is defined by a qubit device) during the application of a dephasing process acting on the qubit device. The coherence measurement process may be sensitive to many parameters of the process, but insensitive to the dephasing process. For example, the dephasing process can be produced by a flux pulse applied to a tunable qubit, and the measurement process can be insensitive to the evolution of the qubit frequency (e.g., coherent Z rotations). This may allow for the characterization of $T2^*$ at the point of operation of a quantum logic gate (e.g., two qubit gates) that is actuated by the process.

FIG. 7A shows an example pulse sequence 700 for coherence time evaluation. As shown in FIG. 7A, the pulse sequence 700 includes a first pulse (+X/2) that causes a rotation about the x-axis, followed by time evolution under a dephasing process (e.g., application of a flux pulse) for a duration $\tau$, followed by a second pulse (+X/2) that causes a rotation about the x-axis plus some phase $\phi$, followed by a readout operation (RO). The pulse sequence 700 may include other operations, or the operations may be performed in another manner in some cases. For example, the visibility of the state after the second pulse (+X/2) can be measured in various ways, such as using phase tomography (e.g., a combination of a single projective measurement of just the X and Y components of the state just after the flux pulse is applied).

In the example pulse sequence 700 shown in FIG. 7A, for each value of $\tau$ (the duration of the dephasing process +F), the phase $\phi$ of the second pulse is swept over several values from $\phi=(0,2\pi]$, causing the readout signal (obtained during RO) to oscillate through $2\pi$ with an amplitude that reflects the decoherence process under test. The dephasing process can be induced, for example, by a flux bias pulse (e.g., a microwave frequency flux bias pulse) applied to a tunable-frequency qubit device (e.g., a tunable transmon device).

FIG. 7B is a plot 720 showing data from an example execution of a coherence time evaluation using the example pulse sequence 700 shown in FIG. 7A. The plot 720 includes two panels 722, 724. The upper panel 724 includes data points representing state visibility measurements from the readout operation in the pulse sequence 700, a curve 726 representing a best fit of the data points in the upper panel 724, and another curve 728 representing an initial guess for the best fit. The lower panel 722 includes data points representing the difference between the best fit curve 726 and the data points in the upper panel 724.

All data points in the upper panel 724 represent state readout measurements obtained for the same value of T (the duration of the dephasing process +F) in the pulse sequence 700, and data point represents a different respective value for the phase of the second pulse (+X/2). As shown, as the value of $\tau$ is held constant between executions of the pulse sequence 700, while the phase $\phi$ is incremented for each execution of the pulse sequence. The phase ϕ is rotated through multiple cycles over the range shown in FIG. 7B; one full cycle of the phase ϕ (rotation through 2π radians) is labeled in the upper panel 724. At least one value of the phase ϕ is obtained in each quadrant. The amplitude of the best fit curve (labeled "Amp" in FIG. 7B) can be extracted from the data shown in FIG. 7B to determine the signal level for the value of τ (the duration of the dephasing process +F) that is used for all data points shown in FIG. 7B. The signal level for multiple values of τ can then be used to characterize the decoherence rate T2*.

FIG. 7C is a plot 730 showing additional data from the example execution of the coherence time evaluation using the example pulse sequence 700 shown in FIG. 7A. The plot 730 includes two panels 732, 734. The upper panel 734 includes data points representing signal level measurements ("Amp") from the analysis shown in FIG. 7B, a curve 736 representing a best fit of the data points in the upper panel 734, and another curve 738 representing an initial guess for the best fit. The lower panel 732 includes data points representing the difference between the best fit curve 736 and the data points in the upper panel 734.

Each data point in the upper panel 734 represents a signal level associated with a different value of the pulse duration τ (the duration of the dephasing process +F) in the pulse sequence 700. The signal level associated with each value of τ is obtained by repeating the pulse sequence 700 with the value of the pulse duration τ held constant and the phase ϕ incremented through one or more full rotations, for example, as shown in FIG. 7B. The data points in the upper panel 734 generally reflect an exponential decay curve, as the signal level declines at an exponential rate T2* with the value τ. The data points in the upper panel 734 can be fit to an exponential to obtain a measurement of the decoherence rate T2*.

In a general aspect of the description above, a quantum processor has a modular architecture.

In a first example, a modular quantum processor includes a first quantum processor chip, a second quantum processor chip, and a cap structure. The first quantum processor chip is supported on a substrate layer and comprises a first plurality of qubit devices. The second quantum processor chip is supported on the substrate layer and comprises a second plurality of qubit devices. The cap structure is supported on the first and second quantum processor chips and comprises an active coupler device. The active coupler device is configured to selectively couple at least one of the first plurality of qubit devices with at least one of the second plurality of qubit devices.

Implementations of the first example may include one or more of the following features. The substrate layer may include a single substrate on which the first and second quantum processor chips are supported. The substrate layer may include multiple substrates on which the first and second quantum processor chips are supported respectively. The substrate layer may include a printed circuit board, and the first and second quantum processor chips may each be bonded to the printed circuit board. The substrate layer may include a first set of signal lines configured to communicate signals between the first plurality of qubit devices and an external control system. The substrate layer may include a second set of signal lines configured to communicate signals between the second plurality of qubit devices and the external control system.

Implementations of the first example may include one or more of the following features. The modular quantum processor may include a two-dimensional array of quantum processor chips supported on the substrate layer, where each quantum processor chip includes a respective plurality of qubit devices. The modular quantum processor may include a plurality of cap structures supported on the two-dimensional array of quantum processor chips, where each cap structure includes signal lines configured to provide coupling between qubit devices of distinct quantum processor chips. Each of the cap structures may be supported by, and may provide coupling between qubit devices of, a respective subset of the quantum processor chips. Each respective subset of the quantum processor chips may include two, three or four of the quantum processor chips. The modular quantum processor can have multiple layers, wherein the plurality of quantum processor chips form a processor layer, the plurality of cap structures form a cap layer, and the processor layer resides between the cap layer and the substrate layer. The modular quantum processor can have multiple layers, wherein the plurality of quantum processor chips form multiple processor layers, the plurality of cap structures form multiple cap layers, and each processor layer resides between a respective one of the cap layers and the substrate layer.

Implementations of the first example may include one or more of the following features. The cap structure may be bonded to the first and second quantum processor chips. The cap structure may include bonds that connect the cap to the respective first and second quantum processor chips. The cap structure may include traces that connect the active coupler device to the respective bonds. The cap structure may include a control line configured to activate or deactivate the active coupler device. Activating the active coupler device selectively couples at least one of the first plurality of qubit devices with at least one of the second plurality of qubit devices. The control line may comprise a flux bias device configured to generate a magnetic flux to activate or deactivate the active coupler device. The active coupler device may include a flux loop configured to receive the magnetic flux generated by the flux bias device.

Implementations of the first example may include one or more of the following features. The modular quantum processor may include a galvanic connection between the first plurality of qubit devices and the active coupler device; and a galvanic connection between the second plurality of qubit devices and the active coupler device. The modular quantum processor may include a capacitive connection between the first plurality of qubit devices and the active coupler device; and a capacitive connection between the second plurality of qubit devices and the active coupler device. The modular quantum processor may include an inductive connection between the first plurality of qubit devices and the active coupler device; and an inductive connection between the second plurality of qubit devices and the active coupler device.

In a second example, a plurality of quantum processor chips are evaluated. Evaluating the plurality of quantum processor chips includes evaluating a plurality of qubit devices of each respective quantum processor chip. Based on the evaluation, the quantum processor chips are categorized according to criteria defining a plurality of categories. A subset of the quantum processor chips is selected from one or more of the plurality of categories. The subset is selected to be included in a modular quantum processor (e.g., according to a design or specifications of a modular quantum processor to be manufactured). The modular quantum processor is then manufactured to include the selected subset of the quantum processor chips.

Implementations of the second example may include one or more of the following features. Evaluating the plurality of qubit devices of each quantum processor chip may include evaluating qubit frequencies of the qubit devices, and the criteria may include a criterion defining a range of qubit frequencies for at least one of the categories. Evaluating the plurality of qubit devices of each quantum processor chip may include evaluating qubit anharmonicities of the qubit devices, and the criteria may include a criterion defining a range of qubit anharmonicities for at least one of the categories.

Implementations of the second example may include one or more of the following features. Evaluating the plurality of qubit devices of each quantum processor chip may include evaluating qubit coherence times of the qubit devices, and the criteria may include a criterion defining a range of qubit coherence times for at least one of the categories. Evaluating the qubit coherence time of a qubit device may include applying an iterative measurement process to the qubit device. Each iteration of the iterative measurement process may include a qubit rotation about a first axis; evolution under a dephasing process; a qubit rotation about a second axis; and a readout operation. The angle between the first axis and the second axis may be varied for each iteration of the iterative measurement process.

Implementations of the second example may include one or more of the following features. Evaluating the plurality of qubit devices of each quantum processor chip may include evaluating a quantum logic fidelity for each qubit device, and the criteria may include a criterion defining a range of quantum logic fidelities for at least one of the categories. Evaluating the plurality of qubit devices of each quantum processor chip may include an optical micrograph analysis of each quantum processor chip. Evaluating the plurality of qubit devices of each quantum processor chip may include batch testing of the plurality of quantum processor chips.

Implementations of the second example may include one or more of the following features. At least one of the categories may be defined by criteria associated with quantum readout operations or quantum memory operations. At least one of the categories may be defined by criteria associated with quantum logic operations.

Implementations of the second example may include one or more of the following features. The plurality of quantum processor chips may be manufactured according to a design specification, and the plurality of quantum processor chips may be evaluated based on the design specification. The criteria may include a criterion associated with a percent error from the design specification. Categorizing the plurality of quantum processor chips may include categorizing according to criteria defining at least three distinct categories of quantum processor chips. The selected subset may include quantum processor chips from at least two of the categories.

Implementations of the second example may include one or more of the following features. The modular quantum processor can be the modular quantum processor of the first example described above, or another type of modular quantum processor.

In a third example, a quantum computing system includes the modular quantum processor of the first example described above; a control system configured to control operation of the modular quantum processor; and a signal delivery system configured to communicate signals between the control system and the modular quantum processor.

In a fourth example, information is stored in a first plurality of qubit devices and a second plurality of qubit devices in a modular quantum processor. The modular quantum processor includes a first quantum processor chip, a second quantum processor chip and a cap structure. The first quantum processor chip is supported on a substrate layer and includes the first plurality of qubit devices. The second quantum processor chip is supported on the substrate layer and includes the second plurality of qubit devices. The cap structure is supported on the first and second quantum processor chips and includes an active coupler device. The information is processed by operation of the modular quantum processor. Processing the information includes operating the active coupler device to selectively couple at least one of the first plurality of qubit devices with at least one of the second plurality of qubit devices.

Implementations of the fourth example may include one or more of the following features. The substrate layer may include a single substrate on which the first and second quantum processor chips are supported. The substrate layer may include multiple substrates on which the first and second quantum processor chips are supported respectively. The substrate layer may include a printed circuit board, and the first and second quantum processor chips may each be bonded to the printed circuit board.

Implementations of the fourth example may include one or more of the following features. Storing and/or processing the information may include communicating control signals through signal lines in the control layer between the first plurality of qubit devices and an external control system. Storing and/or processing the information may include communicating control signals through signal lines in the control layer between the second plurality of qubit devices and the external control system.

Implementations of the fourth example may include one or more of the following features. At least one of the first plurality of qubit devices may be selectively coupled with at least one of the second plurality of qubit devices through bonds that connect the cap structure to the respective first and second quantum processor chips. At least one of the first plurality of qubit devices may be selectively coupled with at least one of the second plurality of qubit devices through traces that connect the active coupler device to the respective bonds. The cap structure may include a control line configured to activate or deactivate the active coupler device. Operating the active coupler device may include delivering a coupler device control signal to the control line. The control line may include a flux bias device. The coupler device control signal may cause the flux bias device to generate a magnetic flux that activates the active coupler device.

Implementations of the fourth example may include one or more of the following features. At least one of the first plurality of qubit devices may be selectively coupled with at least one of the second plurality of qubit devices through a galvanic connection between the first plurality of qubit devices and the active coupler device; and a galvanic connection between the second plurality of qubit devices and the active coupler device. At least one of the first plurality of qubit devices may be selectively coupled with at least one of the second plurality of qubit devices through a capacitive connection between the first plurality of qubit devices and the active coupler device; and a capacitive connection between the second plurality of qubit devices and the active coupler device. At least one of the first plurality of qubit devices may be selectively coupled with at least one of the second plurality of qubit devices through an inductive connection between the first plurality of qubit devices and the active coupler device; and an inductive connection between the second plurality of qubit devices and the active coupler device.

Implementations of the fourth example may include one or more of the following features. The modular quantum processor can be the modular quantum processor of the first example described above, or another type of modular quantum processor.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub combination.

A number of embodiments have been described. Nevertheless, it will be understood that various modifications can be made. Accordingly, other embodiments are within the scope of the following claims.

What is claimed is:

1. A modular quantum processor comprising:
   a first quantum processor chip supported on a substrate layer and comprising a first plurality of qubit devices;
   a second quantum processor chip supported on the substrate layer and comprising a second plurality of qubit devices; and
   a cap structure supported on the first and second quantum processor chips and comprising an active coupler device, wherein the active coupler device is configured to selectively couple at least one of the first plurality of qubit devices with at least one of the second plurality of qubit devices.

2. The modular quantum processor of claim 1, wherein the substrate layer comprises one of:
   a substrate, and the first and second quantum processor chips are supported on the substrate; or
   a printed circuit board, and the first and second quantum processor chips are each bonded to the printed circuit board.

3. The modular quantum processor of claim 2, wherein the substrate layer comprises:
   signal lines configured to communicate signals between the first plurality of qubit devices and an external control system; and
   signal lines configured to communicate signals between the second plurality of qubit devices and the external control system.

4. The modular quantum processor of claim 2, comprising:
   a two-dimensional array of quantum processor chips supported on the substrate layer, each quantum processor chip comprising a respective plurality of qubit devices; and
   a plurality of cap structures supported on the two-dimensional array of quantum processor chips, each cap structure comprising signal lines configured to provide coupling between qubit devices of distinct quantum processor chips.

5. The modular quantum processor of claim 4, wherein each of the cap structures is supported by, and provides coupling between qubit devices of, a respective subset of the quantum processor chips, each respective subset of the quantum processor chips comprising two, three or four of the quantum processor chips.

6. The modular quantum processor of claim 1, wherein the cap structure is bonded to the first and second quantum processor chips.

7. The modular quantum processor of claim 1, wherein the cap structure comprises:
   bonds that connect the cap structure to the respective first and second quantum processor chips; and
   traces that connect the active coupler device to the respective bonds.

8. The modular quantum processor of claim 1, comprising at least one of:
   a galvanic connection between the first plurality of qubit devices and the active coupler device; and a galvanic connection between the second plurality of qubit devices and the active coupler device;
   a capacitive connection between the first plurality of qubit devices and the active coupler device, and a capacitive connection between the second plurality of qubit devices and the active coupler device; or
   an inductive connection between the first plurality of qubit devices and the active coupler device, and an inductive connection between the second plurality of qubit devices and the active coupler device.

* * * * *

UNITED STATES PATENT AND TRADEMARK OFFICE
CERTIFICATE OF CORRECTION

PATENT NO. : 12,033,032 B2
APPLICATION NO. : 17/119089
DATED : July 9, 2024
INVENTOR(S) : Scheer et al.

It is certified that error appears in the above-identified patent and that said Letters Patent is hereby corrected as shown below:

In the Specification

Column 7, Detailed Description, Line 42 Delete "high- quality" and insert -- high-quality -- therefor Column 12, Detailed Description, Line 16 Delete "FIG. SB" and insert -- FIG. 5B -- therefor Column 16, Detailed Description, Line 62 Delete "T" and insert -- $\tau$ -- therefor Column 21, Detailed Description, Line 16 Delete "sub combination." and insert -- subcombination. -- therefor Signed and Sealed this
Third Day of September, 2024

Katherine Kelly Vidal
*Director of the United States Patent and Trademark Office*